(12) United States Patent
Shiraishi et al.

(10) Patent No.: US 6,756,663 B2
(45) Date of Patent: Jun. 29, 2004

(54) SEMICONDUCTOR DEVICE INCLUDING WIRING BOARD WITH THREE DIMENSIONAL WIRING PATTERN

(75) Inventors: Tsukasa Shiraishi, Osaka (JP); Tsutomu Mitani, Hyogo (JP); Kazuyoshi Amami, Osaka (JP); Yoshihiro Bessho, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/337,879

(22) Filed: Jan. 8, 2003

(65) Prior Publication Data

US 2003/0094685 A1 May 22, 2003

Related U.S. Application Data

(60) Division of application No. 09/725,283, filed on Nov. 29, 2000, now Pat. No. 6,525,414, which is a continuation-in-part of application No. 09/153,069, filed on Sep. 15, 1998, now abandoned.

(30) Foreign Application Priority Data

Sep. 16, 1997 (JP) .......................................... P09-250304

(51) Int. Cl.⁷ ............................. H05K 3/46; H05K 1/14; H05K 7/02; H01L 23/02; H01L 23/34

(52) U.S. Cl. ..................... 257/686; 257/685; 257/723; 257/730; 257/777; 257/778; 257/737; 257/738; 257/700; 257/701; 257/754; 257/691; 257/692; 257/668; 257/698; 361/760; 361/763; 361/762; 361/803; 361/807; 361/808; 361/809; 361/767; 361/749; 361/720; 361/783; 174/254; 174/268

(58) Field of Search ................................. 257/686, 685, 257/723, 730, 777, 778, 737, 738, 700, 701, 754, 668, 698, 798, 496, 498, 628, 721, 734, 736, 206, 58, 691, 692; 361/760, 763, 762, 803, 807, 808, 809, 767, 749, 720, 783, 813, 814, 505, 707

(56) References Cited

U.S. PATENT DOCUMENTS

| 4,514,042 A | 4/1985 | Nukii et al. |
| 5,346,750 A | 9/1994 | Hatakeyama et al. ....... 428/209 |

(List continued on next page.)

FOREIGN PATENT DOCUMENTS

| JP | 63-291498 | 11/1988 |
| JP | 2-177449 | 7/1990 |
| JP | 3-262195 | 11/1991 |
| JP | 5-243330 | 9/1993 |

(List continued on next page.)

*Primary Examiner*—Alexander Oscar Williams
(74) *Attorney, Agent, or Firm*—Wenderoth, Lind & Ponack L.L.P.

(57) ABSTRACT

A semiconductor device is made by mounting semiconductor elements on both sides of a wiring board having three-dimensional wiring including inner-via holes. A high operating speed and smaller size are made possible by employing a laminated structure of semiconductor elements without using the chip-on-chip configuration. Semiconductor elements are mounted on both sides of a wiring board having three-dimensional wiring including inner via holes so that the semiconductor elements oppose each other via the wiring board. The electrodes of the semiconductor elements are connected with each other by the three-dimensional wiring of the wiring board.

23 Claims, 20 Drawing Sheets

U.S. PATENT DOCUMENTS

| | | | |
|---|---|---|---|
| 5,448,511 A | 9/1995 | Paurus et al. ............... | 257/686 |
| 5,477,082 A | 12/1995 | Buckley, III et al. ........ | 257/679 |
| 5,646,446 A | 7/1997 | Nicewarner, Jr. et al. ... | 257/723 |
| 5,719,438 A | 2/1998 | Beilstein, Jr. et al. ...... | 257/686 |
| 5,936,843 A | 8/1999 | Ohshima et al. ............ | 257/773 |
| 6,208,521 B1 | 3/2001 | Nakatsuka | |

FOREIGN PATENT DOCUMENTS

| | | |
|---|---|---|
| JP | 6069279 | 3/1994 |
| JP | 7-27925 | 3/1995 |
| JP | 8-17867 | 1/1996 |
| JP | 8-124965 | 5/1996 |
| JP | 11040618 | 2/1999 |
| JP | 11-154728 | 6/1999 |

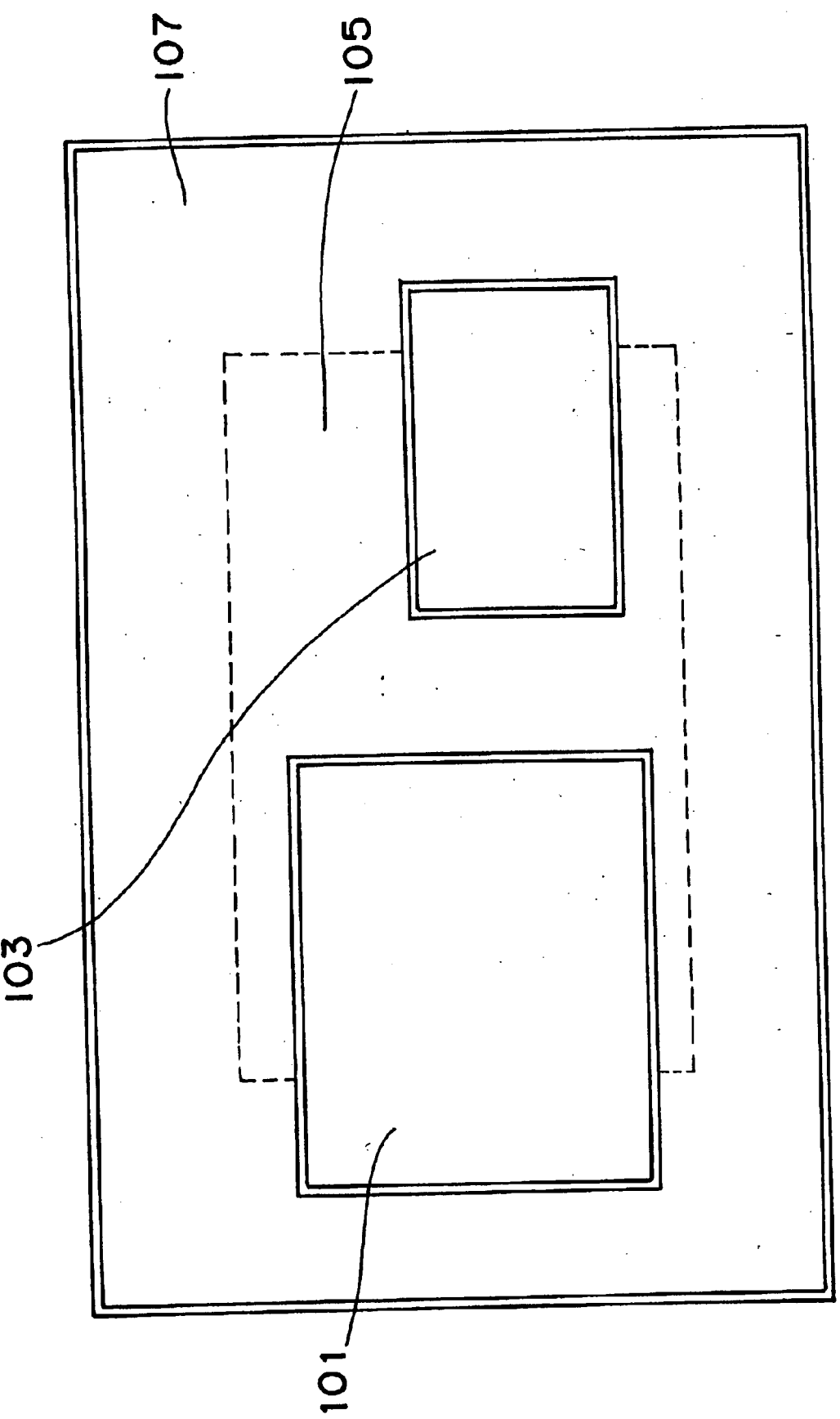

area array arrangement peripheral arrangement

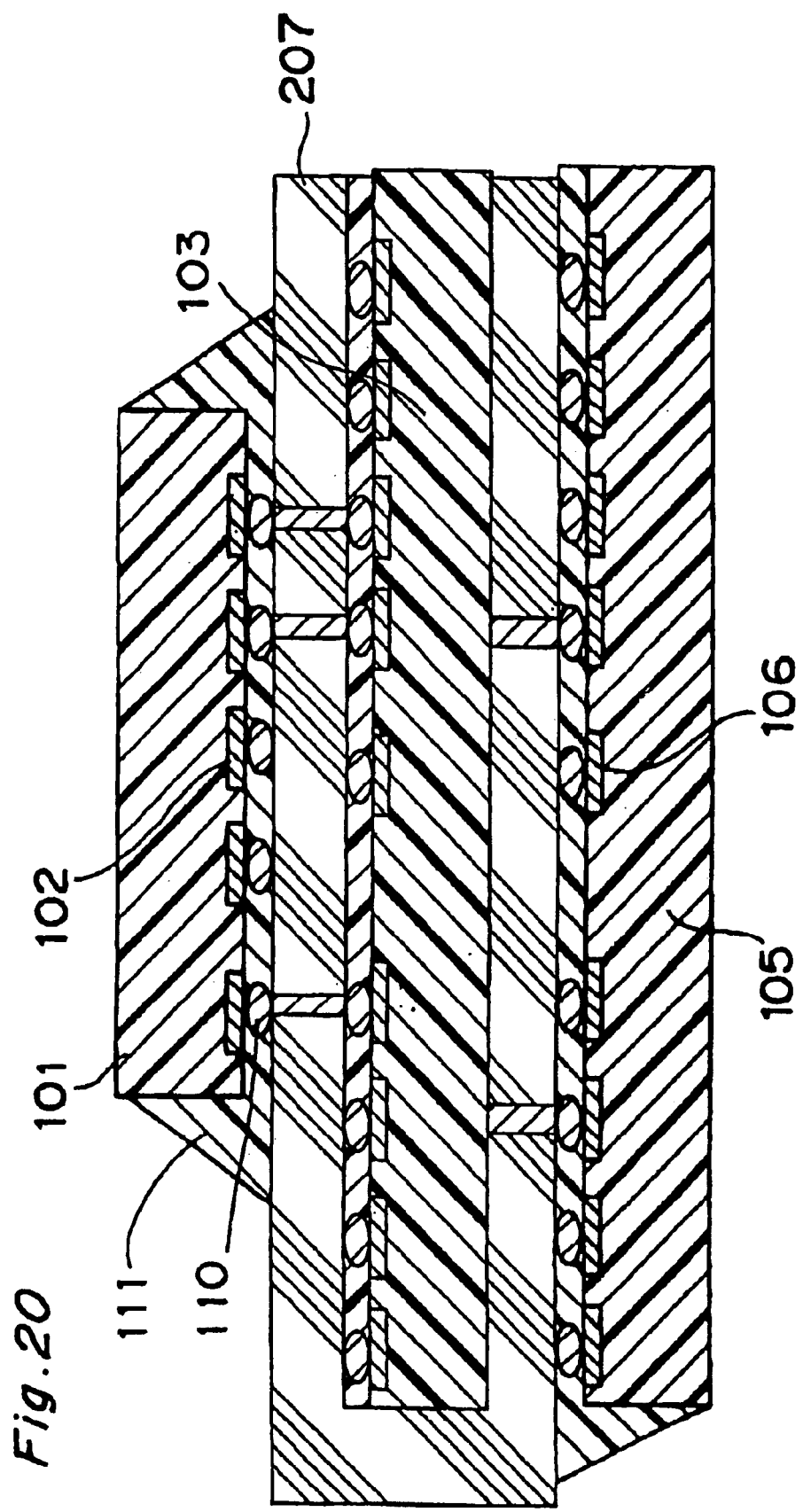

SEMICONDUCTOR DEVICE INCLUDING WIRING BOARD WITH THREE DIMENSIONAL WIRING PATTERN

This application is a Divisional Application of Ser. No. 09/725,283, filed Nov. 29, 2000, now U.S. Pat. No. 6,525,414, which is a Continuation-in-Part Application of Ser. No. 09/153,069, filed Sep. 15, 1998, now abandoned.

BACKGROUND OF THE INVENTION

1. Field of the Invention

The present invention relates to a semiconductor device formed by mounting semiconductor elements on both sides of a wiring board having three-dimensional wiring which uses inner via holes.

2. Description of the Related Art

Attempts have been made to develop a semiconductor element in which a plurality of electronic circuits are incorporated in a single semiconductor element (for example IC chip, MIC chip and OEIC chip) in order to make electronic apparatuses having semiconductor elements used therein more compact. In practice, however, it is difficult to make a single semiconductor element having all necessary functions due to limitations related to semiconductor material, production process, design rule and other factors, and it is often necessary to use a plurality of semiconductor elements. In such a case, in order to make the device smaller in size and run at a higher speed, a chip-on-chip configuration is employed in which the semiconductor elements are directly connected with each other by of electrodes as shown in FIG. 19. In the drawing, numeral 1 denotes a first semiconductor element, 2 denotes electrodes formed on the first semiconductor element 1, 3 denotes a second semiconductor element, 4 denotes electrodes formed on the second semiconductor elements, 10 denotes junctions made mainly of an electrically conductive metallic material such as solder, and 11 denotes a cured insulating resin. When such a chip-on-chip configuration is employed, length of wiring between the semiconductor elements can be made shorter, transmission delay of electric signals is reduced, operation speed of the semiconductor device can be made faster and, because the semiconductor elements are mounted in laminated configuration, it is also possible to make the semiconductor device smaller.

If the first semiconductor element 1 and the second semiconductor element 3 are electrically connected via the junctions 10 in such a chip-on-chip configuration as described above, it is necessary to position the electrodes 2, 4 of the semiconductor elements so that they oppose each other. For this reason, general-purpose semiconductor elements cannot be used and it is required to use semiconductor elements which are designed by taking the positions of the electrodes 2, 4 into consideration. Consequently, it is impossible to design the semiconductor elements separately.

Also because the positions of the electrodes 2, 4 of the first and the second semiconductor elements are restricted, it becomes difficult to reduce the size of the semiconductor device in some cases, eventually resulting in lower production yield.

SUMMARY OF THE INVENTION

An object of the present invention is to provide a semiconductor device which is capable of operating at a higher speed and is smaller in size by employing general-purpose semiconductor devices without using the chip-on-chip configuration.

Particularly, an object of the present invention is to provide a semiconductor device capable of operating at a higher speed and is smaller in size. This is because the wiring length does not increase even when using semiconductor elements such as a CPU, wherein the electrodes are formed in an array arrangement. Although the examples below utilize a multi-layer wiring board, the objects discussed above can also be achieved by using a wiring board including a single insulation layer.

The present inventors have found that it becomes possible to produce semiconductor devices of smaller size while maintaining a high operating speed of the semiconductor elements by mounting general-purpose semiconductor elements so that they oppose each other via a multi-layer wiring board, in which both sides of the multi-layer wiring board has a three-dimensional wiring layout employing inner via holes for connecting electrodes of the semiconductor elements with each other. Particularly, the semiconductor device can be produced without making the wiring longer even when the semiconductor element has an area array type electrode arrangement by employing the three-dimensional wiring as described above. Thus, the present invention has been completed.

That is, the present invention provides a semiconductor device comprising a multi-layer wiring board having at least first and second semiconductor elements mounted on the respective sides of the multi-layer wiring board. Electrodes of the semiconductor element are connected with each other by the three-dimensional wiring. The multi-layer wiring board is made by laminating insulation layers, which comprise resin-impregnated fiber sheets and circuit pattern layers alternately, and has three-dimensional wiring for electrically connecting the circuit pattern layers provided on both sides of the insulation layer via a plurality of inner via holes that are provided through each of the insulation layers.

The semiconductor device according to the present invention can be made smaller in size in a configuration similar to chip-on-chip configuration by employing the general-purpose semiconductor elements because the semiconductor elements are mounted face down by flip chip bonding via the multi-layer wiring board of thin layers. Particularly because the three-dimensional wiring employing the inner via holes is used in the multi-layer wiring board, the semiconductor elements mounted on both sides of the multi-layer wiring board can be connected by the three-dimensional wiring. Therefore, it is possible to make the wiring shorter compared to a case where a conventional wiring board is used in which lead wires are arranged to run over the substrate surface in two-dimensional wiring.

Consequently, according to the present invention, it becomes possible to achieve a high operating speed of the elements by making the semiconductor device smaller in size so as to prevent a delay in electric signals from occurring by using a reduced wiring length. This is similar to the case of employing the conventional chip-on-chip configuration even when the general-purpose semiconductor elements are used.

Also, because the multi-layer wiring board is disposed between the semiconductor elements, the semiconductor element can be mounted or removed without causing a stress in the other semiconductor elements. Thus, it is possible to prevent the semiconductor elements from being damaged.

It is preferable that projections of one or more semiconductor element mounted on either surface of the multi-layer wiring board in a direction perpendicular to the multi-layer wiring board overlap each other.

When the semiconductor elements are mounted on the respective surfaces of the multi-layer wiring board so that projections thereof in a direction perpendicular to the multi-layer wiring board overlap each other, a potential of the multi-layer wiring board 107 to warp in the perpendicular direction (Z axis direction) can be reduced even in a case in which the insulating substrate constituting the multi-layer wiring board is made of a fiber sheet impregnated with a thermosetting resin which has a low rigidity and is liable to warp.

The present invention also provides a semiconductor device comprising first, second and third semiconductor elements laminated via the multi-layer wiring board. The multi-layer wiring board is bonded to cover the back surface of the second semiconductor element by bending the multi-layer wiring board whereon the first and the second semiconductor elements are mounted at specified positions on either side thereof. The third semiconductor element is mounted by flip chip bonding, so as to oppose the back surface of the second semiconductor element via the multi-layer wiring board.

When the multi-layer wiring board of thin layers is bent and the semiconductor device and the multi-layer wiring board are laminated alternately as described above, the semiconductor device can be made small in size even when a large number of semiconductor elements are mounted.

The present invention also provides a module for mounting semiconductor devices comprising the semiconductor device mounted on a mother multi-layer wiring board having a circuit pattern formed on the surface thereof, with the semiconductor device and the mother multi-layer wiring board being connected by electrical connection means.

By mounting the semiconductor elements on the mother multi-layer wiring board, it becomes possible to form a high-density module. It is also possible to improve the productivity of the module by producing the semiconductor devices in advance and by mounting only qualified semiconductor devices on the mother multi-layer wiring board after testing the semiconductor devices for the quality and reliability.

The electrical connection device is preferably a projecting electrode which is interposed between the multi-layer wiring board of the semiconductor device and the mother multi-layer wiring board by bonding the back surface of the second semiconductor element onto the mother multi-layer wiring board so as to place the semiconductor device on the mother multi-layer wiring board. Therefore, the circuit pattern provided on the multi-layer wiring board and the circuit pattern provided on the mother multi-layer wiring board are connected.

By using the projecting electrode for the electrical connection means, it becomes possible to form the connection means which utilizes the empty space between the multi-layer wiring board of the semiconductor device and the mother multi-layer wiring board. Thus, the module of the semiconductor device is smaller in size.

The electrical connection device preferably establishes an electrical connection between the circuit pattern provided on the multi-layer wiring board of the semiconductor device and the circuit pattern provided on the mother multi-layer wiring board. This connection is established because the back surface of the second semiconductor element is bonded onto the mother multi-layer wiring board, and the multi-layer wiring board of the semiconductor device mounted on the mother multi-layer wiring board is bent.

By bending the multi-layer wiring board of the semiconductor device and thereby forming the connection means, it becomes possible to reduce the number of electrode forming processes and thus reduce the production cost.

The electrical connection device is preferably an electrically conductive supporting body which is electrically connected to the wiring in the multi-layer wiring board of the semiconductor device and is also used to fasten the semiconductor device onto the mother multi-layer wiring board. As a result, an electrical connection is established between the wiring of the multi-layer wiring board of the semiconductor device and the circuit pattern provided on the mother multi-layer wiring board by fastening the semiconductor device onto the mother multi-layer wiring board via the electrically conductive supporting body.

By using the semiconductor device having an electrically conductive supporting body such as metal which is electrically connected to the multi-layer wiring board, it becomes possible to handle the supporting body as if it is a pin of QFP and to mount the device onto the mother multi-layer wiring board or remove the device therefrom easily.

The electrical connection device preferably establishes an electrical connection between the circuit pattern provided on the multi-layer wiring board and the circuit pattern provided on the mother multi-layer wiring board as the semiconductor device is mounted on the mother multi-layer wiring board. Therefore, the multi-layer wiring board, which is bonded to cover the back surface of the second semiconductor element by bending the multi-layer wiring board whereon at least the first and the second semiconductor elements are mounted at specified positions on either side thereof, makes contact with the mother multi-layer wiring board.

By using such a connection device as described above, it becomes possible to make a connection by using the lower region of the mounting surface of the semiconductor element and thereby make the module of the semiconductor device smaller in size.

The present invention also provides a module of the semiconductor device wherein an alternate lamination of the semiconductor device and the multi-layer wiring board is mounted on the mother multi-layer wiring board which has a circuit pattern formed on the surface thereof. Furthermore, the circuit pattern provided on the multi-layer wiring board of the semiconductor device and the circuit pattern provided on the mother multi-layer wiring board are electrically connected to each other.

By using such a module as described above, the semiconductor device can be mounted on the mother multi-layer wiring board with a high density.

The present invention also provides a semiconductor device wherein the electrodes of at least one of the first and the second semiconductor elements are formed in an area array arrangement.

In the multi-layer wiring board according to the present invention, use of the three-dimensional wiring which employs the inner via holes makes it possible to connect between the semiconductor elements mounted on both sides of the multi-layer wiring board in three-dimensional wiring. Consequently, the wiring length can be made shorter compared to a case such as the conventional wiring board in which lead wires are arranged so as to run over the surface of the wiring board in two-dimensional wiring. This configuration is effective for mounting semiconductor elements which have electrodes near the center as well as in the peripheral portions thereof, such as a semiconductor device having electrodes arranged in an area array arrangement.

The present invention also provides a semiconductor device comprising a first semiconductor element having the electrodes arranged in area array arrangement and a second semiconductor element having the electrodes arranged in peripheral arrangement. Both semiconductor elements are mounted face down on the respective surfaces of the multi-layer wiring board by flip chip bonding, wherein the electrodes of both semiconductor elements are connected to each other by the three-dimensional wiring.

As the semiconductor elements are mounted face down by flip chip bonding via the thin layer multi-layer wiring board in the semiconductor device of the present invention, it becomes possible to mount the semiconductor elements by flip chip bonding and make the semiconductor device smaller in size.

In the multi-layer wiring board according to the present invention, use of the three-dimensional wiring comprising inner via holes makes it possible to connect between the semiconductor elements mounted on both sides of the multi-layer wiring board in three-dimensional vertical wiring. Consequently, the wiring can be made shorter compared to a case such as the conventional wiring board in which lead wires are arranged to run over the surface of the wiring board in two-dimensional wiring.

Therefore, the present invention makes it possible to make the semiconductor device smaller in size even when mounting the semiconductor elements having electrodes arranged in area array arrangement. Reduction of the wiring length also makes it possible to increase the operating speed by preventing delay in electrical signals, and to reduce the power consumption by decreasing the resistance of the wiring.

The present invention also provides a semiconductor device wherein the semiconductor element having the electrodes arranged in an area array arrangement is mounted face down on one surface of the multi-layer wiring board by flip chip bonding and electronic components are mounted on the other surface of the multi-layer wiring board. In this arrangement, the electrodes of the semiconductor element and the electrodes of the electronic components are connected with each other by the three-dimensional wiring.

Because the three-dimensional wiring by inner via holes is employed in the multi-layer wiring board of the semiconductor device according to the present invention, the semiconductor element and the electronic components, such as a bypass capacitor mounted on either side of the multi-layer wiring board, can be connected to each other by three-dimensional wiring. In addition, the wiring length can be made shorter compared to a case such as the conventional wiring board in which lead wires are arranged to run over the surface of the wiring board in two-dimensional wiring.

Therefore, noise can be effectively removed during high-speed operation. In particular, when connecting the central electrode of the semiconductor element having electrodes arranged in an area array arrangement and the electronic component, the wiring length can be made far shorter than in the conventional wiring board.

The electronic component is preferably a bypass capacitor. When a bypass capacitor is used as the electronic component, it becomes possible to effectively remove noise due to the bypass capacitor by reducing the wiring length and thereby reducing the noise in the wiring.

As will be clear from the above description, the semiconductor device according to the present invention has semiconductor elements mounted so as to oppose each other via the multi-layer wiring board with the electrodes of the semiconductor elements being connected to each other by means of the three-dimensional wiring of the multi-layer wiring board. Therefore, the elements can be connected with each other regardless of the arrangement of the electrodes of the semiconductor elements, thus making it possible to connect the general-purpose semiconductor elements without modification by a method similar to the chip-on-chip connection and to provide a semiconductor device of smaller size and higher operating speed.

According to the present invention, since a multi-layer wiring board is used instead of the conventional printed circuit board and because connection between the semiconductor elements is made by using the three-dimensional wiring based on the inner via holes which makes it easier to run the lead wires, wiring length can be reduced. Thus, delays are prevented from occurring in the circuit response due to the wiring length, so that the operating speed of the semiconductor device can be increased.

Because the semiconductor elements are not connected directly with each other, it becomes possible to remove or mount any of the semiconductor elements without causing damage to the other semiconductor elements. Also, because the semiconductor device is mounted on the mother multi-layer wiring board, high-density packaging is made possible, thereby contributing to the size reduction of electronic apparatuses.

Further in case the semiconductor element having electrodes of area array arrangement is mounted face down by flip chip bonding, connecting by the multi-layer wiring board 105 having the inner via holes 109 therein makes it possible to reduce the wiring length, increase the operating speed of the semiconductor device, and reduce the power consumption.

In the case of the semiconductor element having electrodes of area array arrangement, in particular, wiring length of the electrode located near the center of the semiconductor element can be greatly reduced compared to a semiconductor device which employs the conventional wiring board.

Also by connecting the bypass capacitors and the semiconductor elements by the three-dimensional wiring comprising the inner via holes, it becomes possible to reduce the wiring length and reduce the noise generated in the semiconductor device.

BRIEF DESCRIPTION OF THE DRAWINGS

FIG. 3 is a top view of the semiconductor device according to the first embodiment of the present invention.

FIG. 20 is a cross sectional view of the semiconductor device according to a variation of the seventh embodiment of the present invention, in which a wiring board with a single insulation layer is utilized.

DETAILED DESCRIPTION OF THE INVENTION

Embodiment 1

Figure 1A:
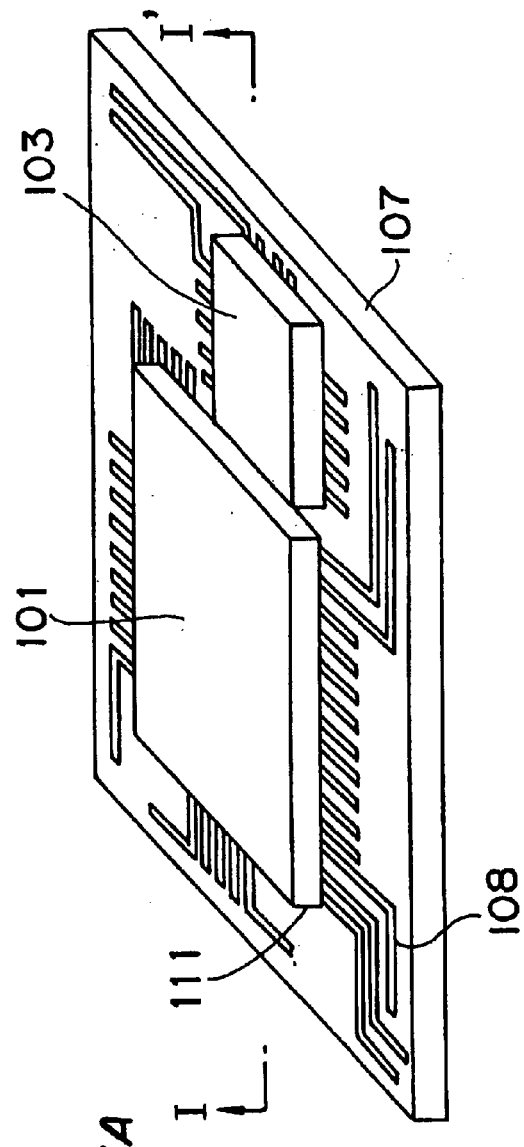
FIG. 1A is a perspective view of the semiconductor device according to a first embodiment of the present invention.
Figure 1B:
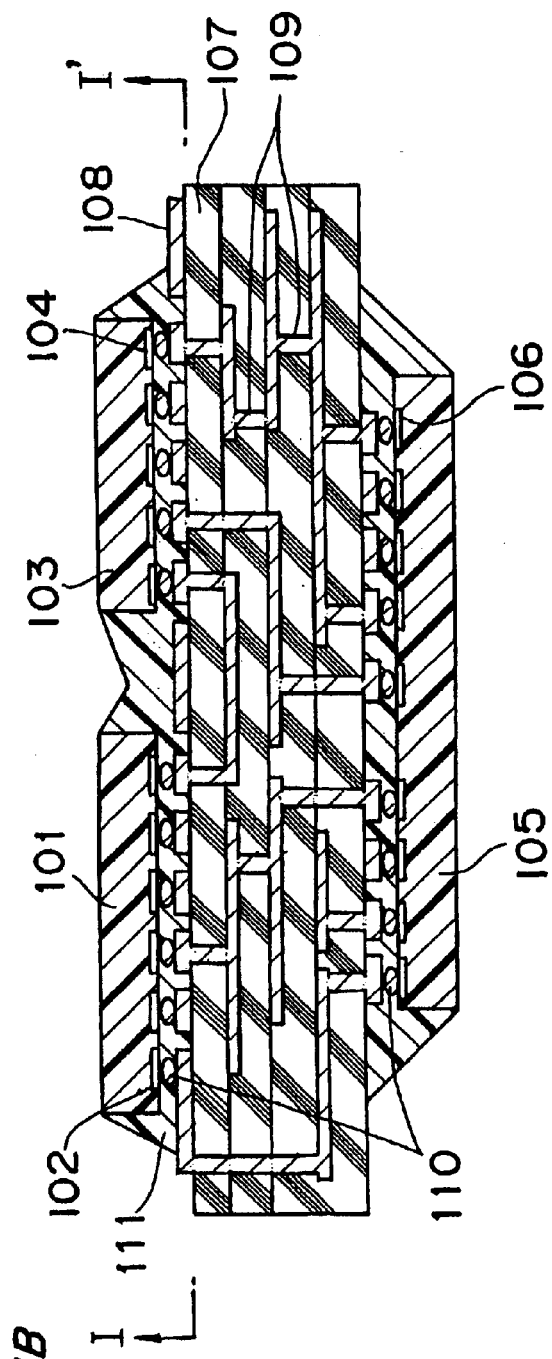
FIG. 1B is a cross sectional view taken along lines I–I' of FIG. 1A.

FIGS. 1A, 1B show a semiconductor device according to the first embodiment of the present invention. This semiconductor device has two semiconductor elements on one side and one semiconductor element on the other side.

FIG. 1A is a perspective view of the semiconductor device and FIG. 1B is a cross sectional view taken along lines I–I' of the semiconductor device shown in FIG. 1A. In the drawing, numeral 101 denotes a first semiconductor element, 102 denotes an electrode formed on an element forming surface of the semiconductor element 101, 103 denotes a second semiconductor element, 105 denotes a third semiconductor element, 104 and 106 denote electrodes formed on the respective semiconductor elements, 107 denotes a multi-layer wiring board, 108 denotes a circuit pattern formed on the surface layer of the multi-layer wiring board, and 109 denotes inner via holes. Numeral 110 denotes junctions which provide electrical connection between the semiconductor elements 101, 103, 105 and the circuit pattern formed on the surface layer of the multi-layer wiring board 107, and 111 denotes an electrically insulating thermosetting resin. In the following embodiments, it is also possible to utilize a wiring board 207 which has only a single insulation layer, as shown in FIG. 20.

In the process of producing the semiconductor device shown in FIG. 1, first the three semiconductor elements 101, 103, 105 are prepared and ball bumps made of Au are formed on the surfaces of the electrodes 102, 104, 106, and then a required amount of an electrically conductive adhesive is applied onto the tips of the ball bumps. The electrically conductive adhesive is a mixture of a powder of electrically conductive metal such as Ag, Cu or Ni and a resin.

The semiconductor elements 101, 103 having the ball bumps made of Au or the like formed thereon with the electrically conductive adhesive applied thereto are mounted on the front surface of the multi-layer wiring board 107, and the semiconductor element 105 is mounted on the back surface of the multi-layer wiring board 107. Each of the elements is mounted face down by flip chip bonding so that the semiconductor elements on both sides oppose each other via the multi-layer wiring board 107, with the adhesive cured by a heat treatment.

Figure 2A:
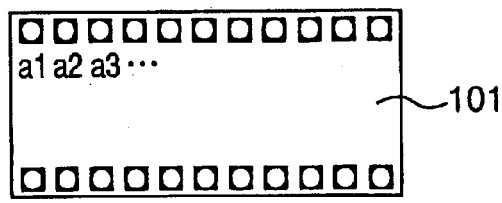
FIGS. 2A, 2B, 2E are view showing the arrangement of the bumps formed on the semiconductor element according to the first embodiment of the present invention.
Figure 2B:
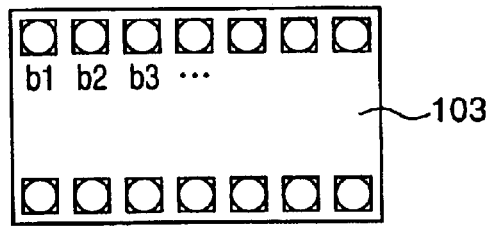
Figure 2C:
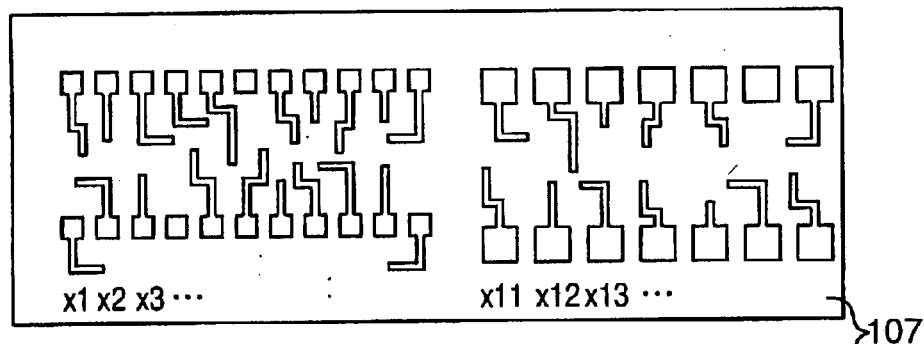
FIGS. 2C, 2D are views showing the circuit pattern of the multi-layer wiring board according to the first embodiment of the present invention.
Figure 2D:
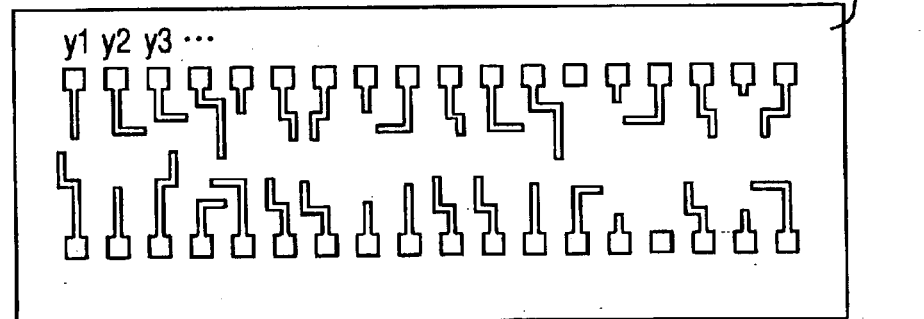
Figure 2E:
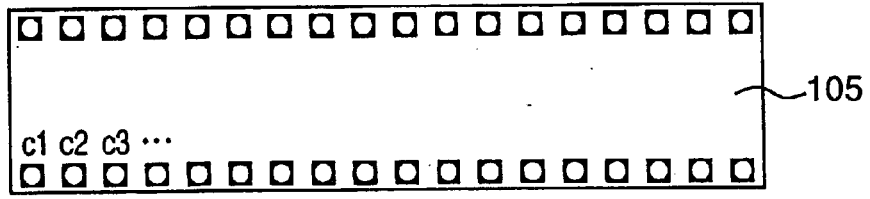

FIGS. 2A, 2B, 2E show the layout of bumps provided on the back surfaces of the first semiconductor element 101, the second semiconductor element 103 and the third semiconductor element 105. FIGS. 2C, 2D show the circuit patterns formed on the top surface and the back surface of the multi-layer wiring board 107, respectively, whereon the semiconductor elements are mounted.

Bumps a1, a2, a3 and so on formed on the back surface of the first semiconductor element 101 and bumps b1, b2, b3 and so on formed on the back surface of the second semiconductor element 103 are connected to the electrodes x1, x2, x3 and so on. The electrodes x11, x12, x13 and so on are formed on the top surface of the multi-layer wiring board 107, respectively.

Bumps c1, c2, c3 and so on formed on the back surface of the third semiconductor element 105 are connected to the electrodes y1, y2, y3 and so on formed on the bottom surface of the multi-layer wiring board 107.

The three-dimensional wiring of the multi-layer wiring board 107 establishes the electrical connection between the electrodes x1 and y1, between x2 and y2, between x3 and y3 and so on which are formed on the top and bottom surfaces of the multi-layer wiring board 107, respectively.

Consequently, because the first and the second semiconductor elements 101, 102 are mounted on one side, and the third semiconductor element 105 is mounted on the other side of the multi-layer wiring board 107, the electrodes of the semiconductor elements are connected with each other by the three-dimensional wiring of the multi-layer wiring board 107. Thus, a laminated construction similar to the conventional chip-on-chip configuration is achieved.

After the electrically conductive adhesive is cured si as to fasten the semiconductor elements 101, 103, 105 onto the multi-layer wiring board 107, the semiconductor elements are subjected to electrical tests to make sure of normal functions thereof.

Then after filling the gap between the semiconductor elements 101, 103, 105 and the multi-layer wiring board 107 with an insulating thermosetting resin 111, the insulating thermosetting resin 111 is completely cured by a heat treatment. As a result, the mechanical strength and quality of connection is increased.

In case any of the semiconductor elements is found to be defective in the electrical test, only the defective semiconductor element is removed and replaced with a new semiconductor element. In this regard, bonding strength of the semiconductor elements is controlled to a minimum necessary level thereby to make it easy to remove the semiconductor element. Proper bonding strength per one bump for this purpose is about $3 \times 10^6$ to $30 \times 10^6$ $N/m^2$.

The multi-layer wiring board 107 comprises insulating substrates made of resin-impregnated fiber sheets described in Japanese Patent Kokai Publication No. 6-268345 and circuit patterns laminated alternately. The three-dimensional wiring is formed so as to connect the electrically conductive inner via holes formed through the insulating substrates and the circuit patterns.

The insulating substrate of the multi-layer wiring board 107 preferably consists of a fiber sheet made of glass fiber, aramid fiber or the like impregnated with a thermosetting resin. This is for the purpose of reducing the stress generated in the semiconductor elements to be mounted thereon and in the junctions by taking advantage of the Young's modulus of the resin-impregnated fiber sheet being lower than that of a wiring board which uses an inorganic material such as ceramics for the insulating substrate.

The material such as glass fiber and aramid fiber included in the substrate decreases the value of the thermal expansion coefficient, and also contributes to the reduction of the stress generated in the semiconductor elements to be mounted thereon and in the junctions.

Use of the fiber sheet such as glass fiber and aramid fiber impregnated with the thermosetting resin for the insulating substrate of the multi-layer wiring board 107 reduces the stress generated in the semiconductor elements and in the junctions, thereby making it possible to produce high-quality semiconductor devices.

FIG. 3 is a plan view of the semiconductor device according to this embodiment viewed from the side of the first semiconductor element 101, wherein reference numerals identical to those of FIG. 1 denote the identical or corresponding portions.

As will be seen from FIG. 3, the projection of the semiconductor elements 101, 103 in the direction (hereinafter called Z axis direction) perpendicular to the wiring forming surface of the multi-layer wiring board 107 overlaps at least partially with the projection of the semiconductor element 105, which is mounted on the back surface, in the direction perpendicular to the wiring forming surface of the multi-layer wiring board 107. By arranging the semiconductor elements 101, 103, 105 in this configuration, the semiconductor device of the present invention becomes substantially symmetrical in the Z-axis direction with respect to the multi-layer wiring board 107.

As the semiconductor elements are disposed substantially symmetrically in the Z axis direction with respect to the multi-layer wiring board 107, the possibility that the insulating substrate of the multi-layer wiring board 107 will warp in the Z axis direction can be reduced even when the insulating substrate is made of the fiber sheet impregnated with the thermosetting resin which has a low rigidity and is liable to warp.

Because the semiconductor device of the present invention can be made with less warping, it is easier to mount the semiconductor device on the other wiring board and reduce the residual stress after mounting.

According to this embodiment, as described above, electrical connection between the first and the second semiconductor elements 101, 103 and the third semiconductor element 105 is made by means of the multi-layer wiring board 107. Therefore, it becomes possible to connect the elements with each other regardless of the positions of the electrodes formed on the semiconductor elements. Consequently, a connection similar to that of chip-on-chip mounting can be made by using the general-purpose semiconductor elements without modification.

When compared to a case of connecting semiconductor elements by using a wiring board of the conventional in which an inter-layer connection is made by forming the conventional through holes, use of the multi-layer wiring board 107 makes it possible to form three-dimensional wiring by inner via holes, increase the wiring density, and increase the degree of freedom in the design of inter layer connection. As a result, it becomes easier to run the lead wires. Thus, because the use of the multi-layer wiring board 107 in wiring between similar semiconductor elements makes it possible to reduce the number of insulating layers to be laminated and to reduce the wiring length, the semiconductor device can be made smaller in size. It is advantageous to make the semiconductor device of shorter wiring length and higher operating speed.

Also, because the semiconductor elements are not directly connected with each other, any of the semiconductor elements can be mounted or removed without causing damage to the other semiconductor elements (for example damage due to stress generated in the leads of the semiconductor elements).

Further, because the semiconductor elements 101, 103, 105 are arranged in a substantially symmetrical configuration in the Z axis direction with respect to the multi-layer wiring board 107, the possibility that the multi-layer wiring board 107 will warp in the Z axis direction can be reduced even when the insulating substrate of the multi-layer wiring board 107 is made of the fiber sheet impregnated with the thermosetting resin which has a low rigidity and is liable to warp.

Although the junctions 110 of the semiconductor elements are made from the Au ball bumps formed on the electrodes of the semiconductor elements and the electrically conductive adhesive in this embodiment, the bumps may also be formed by soldering or a process other than wire bonding. The bumps may be formed on the multi-layer wiring board 107, and the electrically conductive adhesive may also be replaced with cream solder.

The similar effect may be obtained by using another flip tip mounting technique, such as a solder bump method employed by Motorola Corp., or a method using an anisotropically conductive film (ACF). If an anisotropically conductive film is used, replacement of a defective semiconductor element is done by locally heating the anisotropically conductive film.

Embodiment 2

Figure 4:
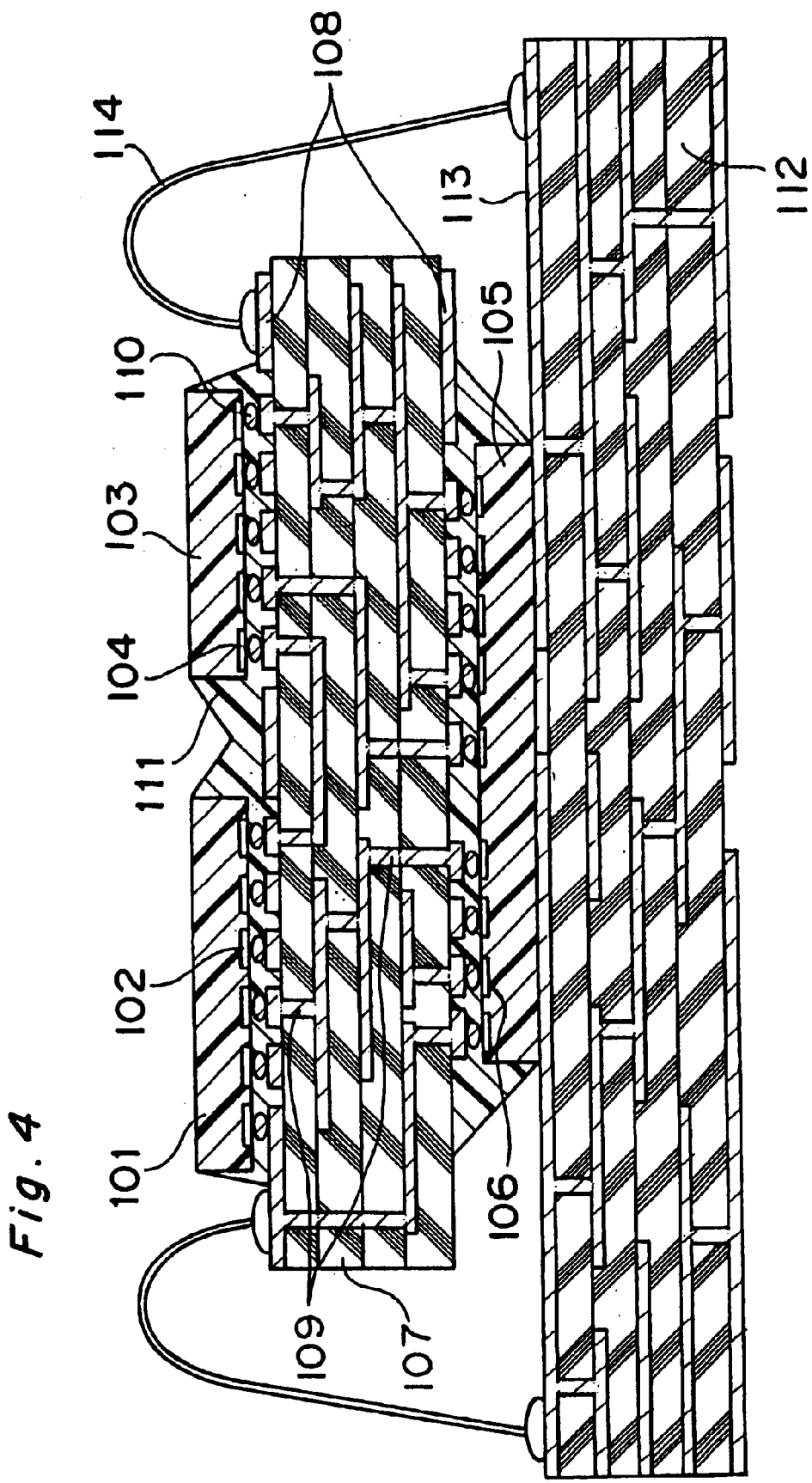
FIG. 4 is a cross sectional view of the module of the semiconductor device according to a second embodiment of the present invention.

FIG. 4 is a cross sectional view of a module of the semiconductor device according to a second embodiment of the present invention. In the drawing, reference numerals identical to those of FIG. 1 denote the identical or corresponding portions. Numeral 112 denotes a mother wiring board whereon the semiconductor device is to be mounted, 113 denotes a circuit pattern formed in the surface layer of the mother wiring board, 114 denotes an Au wire for electrically connecting the multi-layer wiring board and the mother multi-layer wiring board.

The module according to this embodiment is produced by such processes as shown in FIG. 4, the semiconductor device comprising the multi-layer wiring board 107, whereon the semiconductor elements which have passed electrical tests are mounted, is fastened on the mother multi-layer wiring board 112 at a specified position by bonding the back surface of the third semiconductor element 105 onto the mother multi-layer wiring board 112 by means of an adhesive or the like. Then the circuit pattern 108 on the front surface of the multi-layer wiring board 107 and the circuit pattern 113 on the front surface of the mother multi-layer wiring board 112 are connected with each other by the Au wire 114.

According to this embodiment, because the high-quality semiconductor device with less warp in the Z axis direction is mounted on the mother multi-layer wiring board, a semiconductor device module of extremely high quality and high productivity can be produced.

Also, because the semiconductor elements 101, 103, 105 mounted on the semiconductor device are made in such a configuration as to be laminated in the Z axis direction, the surface area of the mother wiring board can be made smaller and the present invention can be applied to electronic apparatuses which are required to be smaller in size.

Although the Au wire 114 is used for the electrical connection means between the multi-layer wiring board 107 and the mother multi-layer wiring board 112 in FIG. 4, TAB (tape-automated bonding) or the like may also be used instead of the Au wire 114.

Particularly in this embodiment, because the multi-layer wiring board 107 and the mother wiring board 112 are made of the same material, physical constants such as thermal expansion coefficients of the two wiring boards are the same. Consequently, the stress generated in the third semiconductor element 105 which is interposed between both wiring boards is decreased and the quality of the module can be improved.

Embodiment 3

Figure 5:
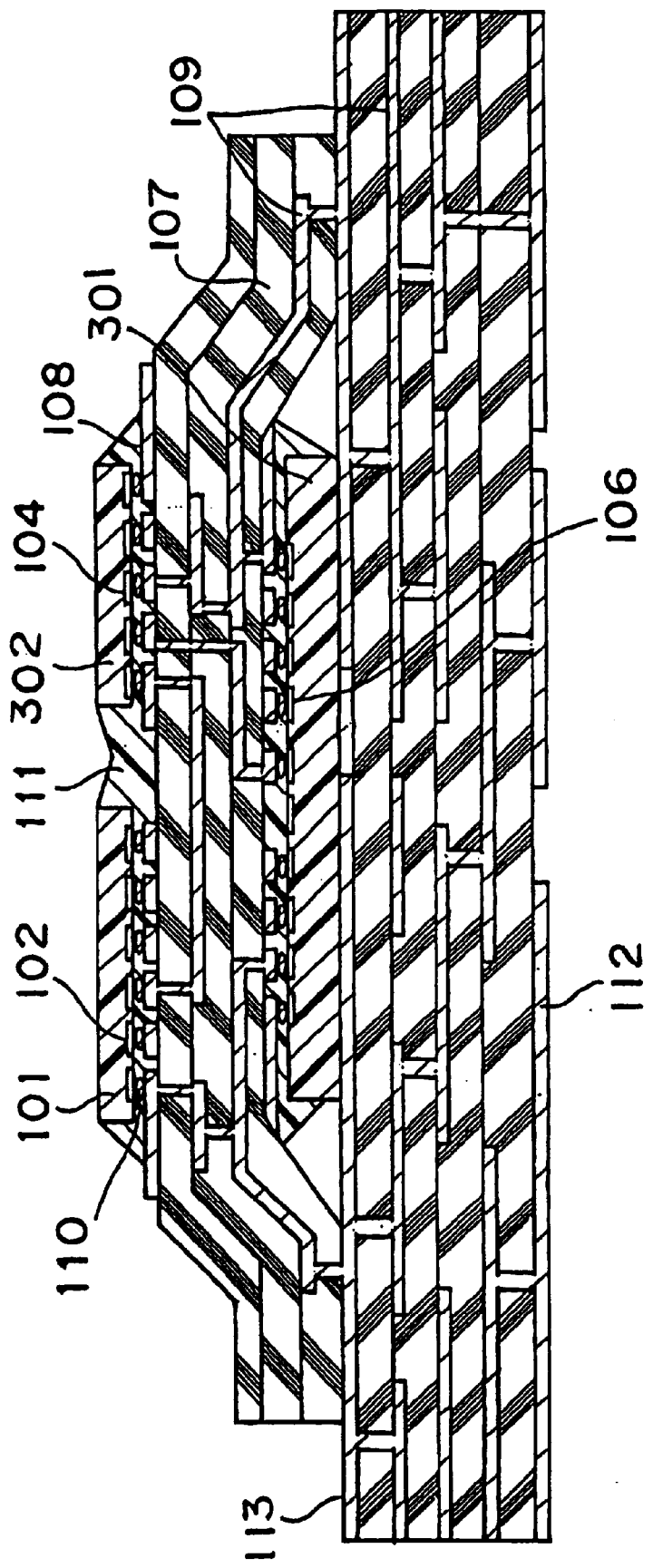
FIG. 5 is a cross sectional view of the module of the semiconductor device according to a third embodiment of the present invention.

FIG. 5 is a cross sectional view of a module of the semiconductor device according to the third embodiment of the present invention. In the drawing, reference numerals identical to those of FIG. 4 denote the identical or corresponding portions.

As can be seen in FIG. 5, a second semiconductor element 301 is mounted on the second side of the first wiring board 107, and the second semiconductor element 301 can be larger than the first semiconductor element 101, which is mounted on the first side of the first wiring board 107. In addition, the semiconductor device can include a third semiconductor element 302, which is also mounted on the first side of the first wiring board and is electrically connected to both the first and second semiconductor elements.

In the module according to this embodiment, the semiconductor device (including the first wiring board, the first semiconductor element, and the second semiconductor element) is mounted on the mother (second) multi-layer wiring board 112 by a method similar to that of the second embodiment.

The first multi-layer wiring board 107 which forms part of the semiconductor device has a thickness of about 200 mm, for example, and has a certain level of elasticity. Thus, it becomes possible to connect the first multi-layer wiring board 107 directly to the mother (second) wiring board by bending the multi-layer wiring board 107. For example, both the first end and second end of the first multi-layer wiring board are bent toward the second wiring board.

Therefore, the multi-layer wiring board 107 of the semiconductor device mounted on the mother multi-layer wiring board 112 is bent and the circuit pattern provided on the multi-layer wiring board 107 and the circuit pattern provided on the mother multi-layer wiring board 112 are directly connected to each other. Consequently, the electrical connection between both wiring boards is established, and the module for the semiconductor device is produced.

This process reduces the amount of connection material such as Au wire to be used and reduces the number of processes for producing the module. Thus, it is possible to provide the module for the semiconductor device at a low cost with high productivity.

Embodiment 4

Figure 6:
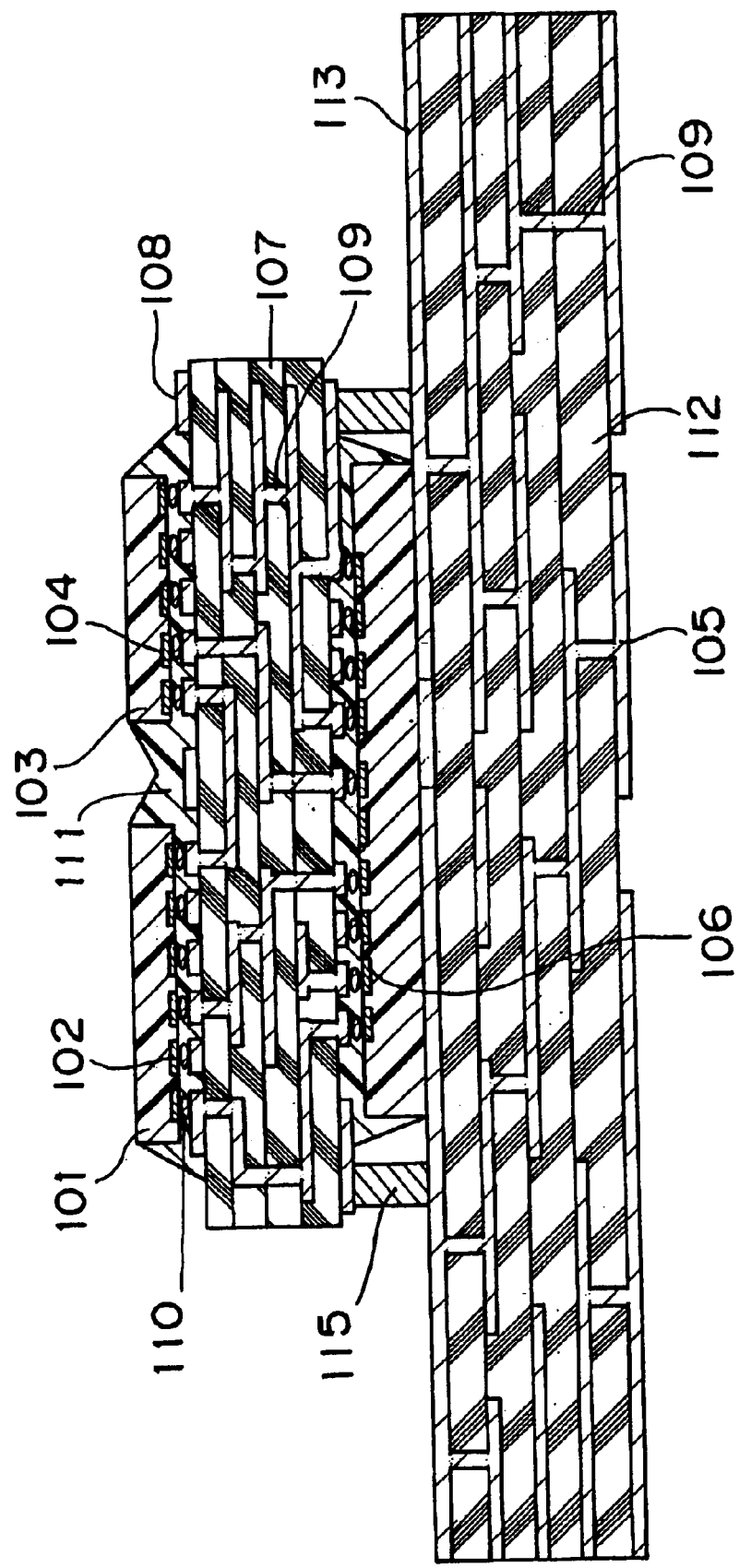
FIG. 6 is a cross sectional view of the module of the semiconductor device according to a fourth embodiment of the present invention.

FIG. 6 is a cross sectional view of a module of the semiconductor device according to a fourth embodiment of the present invention. In the drawing, reference numerals identical to those of FIG. 4 denote the identical or corresponding portions. Numeral 115 denotes an electrical junction such as bump electrode.

In the module according to this embodiment, the semiconductor device is mounted on the mother multi-layer wiring board 112 by a method similar to that of the second embodiment.

Protruding electrodes 115 as shown in FIG. 6 are used as the means for connecting the multi-layer wiring board 107 of the semiconductor device and the mother multi-layer wiring board 112. The protruding electrode 115 has a configuration similar to that of the junction 110 used in connecting the semiconductor element 101 or the like and the multi-layer wiring board 107. That is, after forming the ball bumps made of Au on the circuit pattern of the mother multi-layer wiring board 112, a required amount of electrically conductive adhesive is applied to the tips of the bumps, and the circuit pattern formed on the multi-layer wiring board 107 is placed thereon so as to electrically connect the two wiring boards. If some of the electrodes 102, 104 of the first semiconductor element 101 or the second semiconductor element 103 are exposed without being covered by the multi-layer wiring board 107, it may be connected with the junction layer 115 of the protruding electrode.

According to this embodiment, the two wiring boards can be connected to each other by utilizing the narrow space between the semiconductor device and the mother multi-layer wiring board 112. Therefore, the semiconductor devices can be mounted on the mother multi-layer wiring board 112 in a high density, thereby contributing to the size reduction of electronic apparatuses.

Embodiment 5

Figure 7:
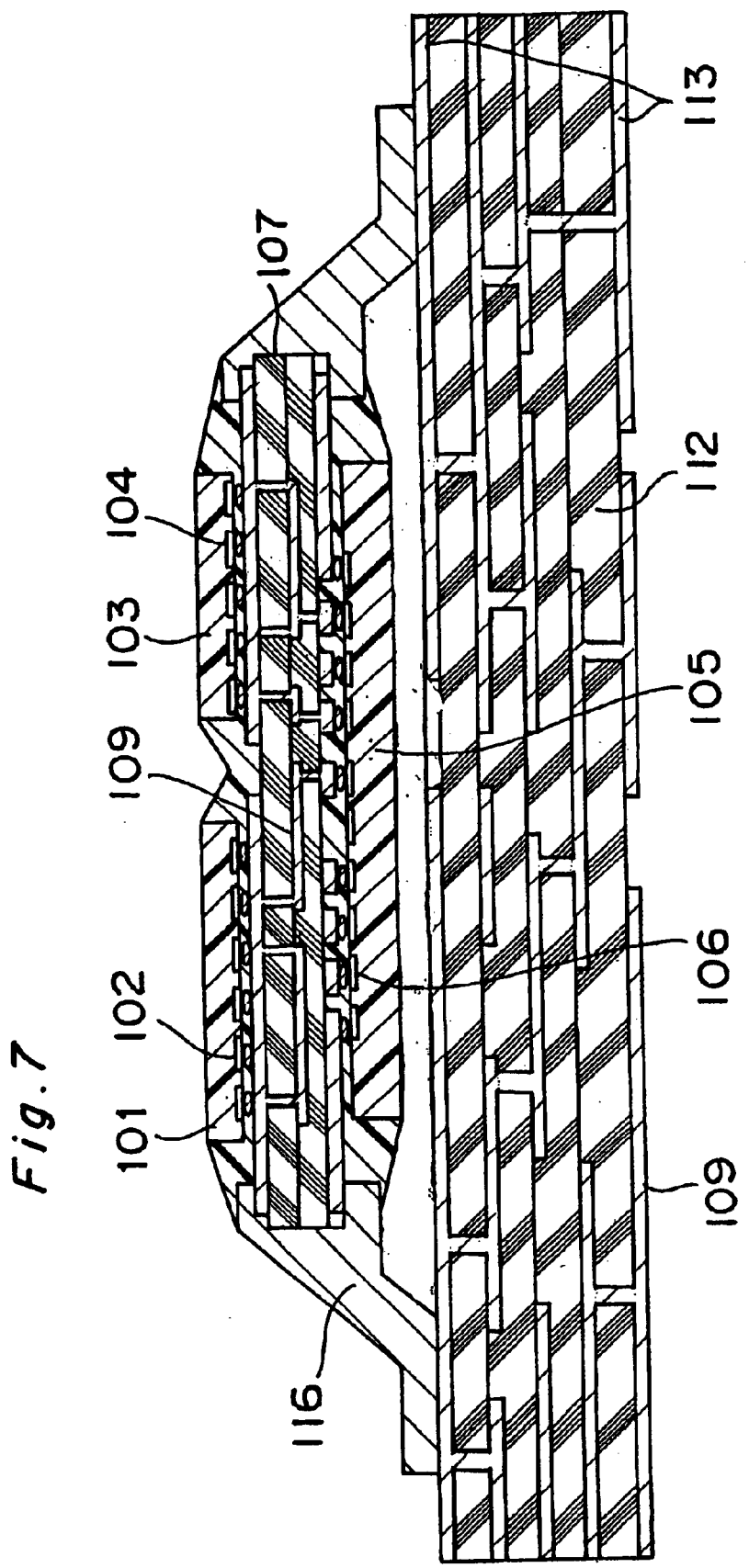
FIG. 7 is a cross sectional view of the module of the semiconductor device according to a fifth embodiment of the present invention.

FIG. 7 is a cross sectional view of a module of the semiconductor device according to a fifth embodiment of the present invention. In the drawing, reference numerals identical to those of FIG. 4 denote identical or corresponding portions. Numeral 116 denotes an electrically conductive supporting body.

In the module of the semiconductor device according to this embodiment, the semiconductor device is mounted on the mother multi-layer wiring board 112 by using the electrically conductive body 116 such as a metal frame which is electrically connected to the multi-layer wiring board 107 of the semiconductor device.

Electrical connection and mechanical fastening of the electrically conductive body 116 are made by holding the circuit pattern 108 of the multi-layer wiring board 107 at an edge of the multi-layer wiring board 107 and soldering or the like.

The semiconductor device is connected with the mother multi-layer wiring board 112 via the electrically conductive body 116.

According to this embodiment, it becomes possible to handle the semiconductor device equipped with the electrically conductive body 116 as if it is a QFP (quad flat module), and to mount the semiconductor device on the mother multi-layer wiring board 112. Thus, it becomes easier to inspect and mount the semiconductor device and to replace the semiconductor device in case of a failure.

Embodiment 6

Figure 8:
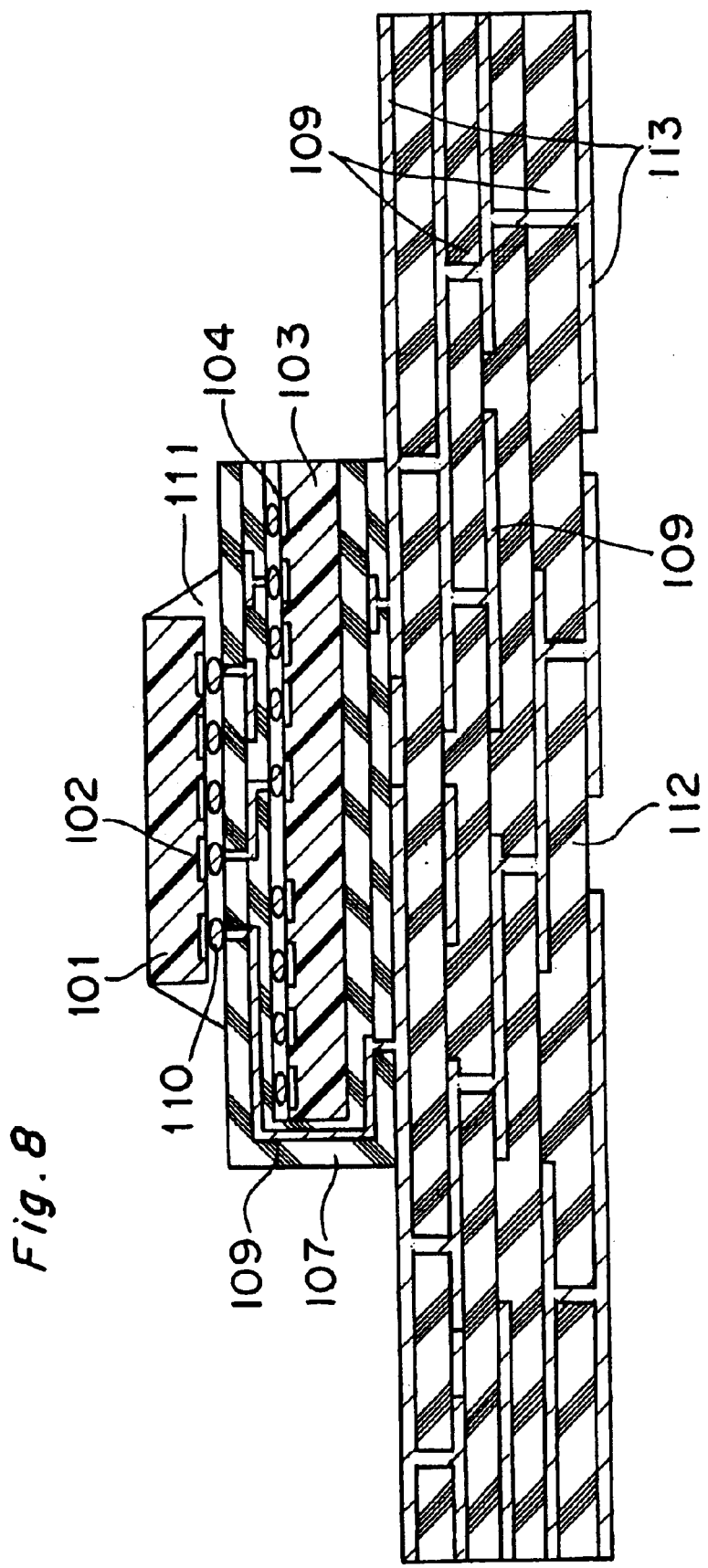
FIG. 8 is a cross sectional view of the module of the semiconductor device according to a sixth embodiment of the present invention.

FIG. 8 is a cross sectional view of a module of the semiconductor device according to a sixth embodiment of the present invention. In the drawing, reference numerals identical to those of FIG. 4 denote the identical or corresponding portions.

In this embodiment, as shown in FIG. 8, the first semiconductor element 101 and the second semiconductor element 103 are mounted so as to oppose each other via the multi-layer wiring board 107. In words, the front surface of first semiconductor element 101 faces the first side of wiring board 107, and the front surface of second semiconductor element 103 faces the second side of wiring board 107. As shown in FIG. 8, at least a portion of the front surface of the second semiconductor element 103 opposes (faces) at least a portion of the front surface of the first semiconductor element 101 via wiring board 107. The multi-layer wiring board 107 is also bent to cover the back surface of the second semiconductor element 103 and is bonded onto the back surface by an adhesive or the like.

The semiconductor device is mounted on the mother multi-layer wiring board 112 so that the circuit pattern formed on the multi-layer wiring board 107 is electrically connected to the circuit pattern formed on the mother multi-layer wiring board 112.

Since this configuration makes it unnecessary to provide particular means for electrically connecting the semiconductor device and the mother multi-layer wiring board 112, the amount of electrode material and the number of producing processes can be reduced. In addition, since the portion under the semiconductor device becomes the electrical connection means, the surface area of the mother multi-layer wiring board 112 can be effectively utilized thereby making it possible to mount the semiconductor devices in a high density and contribute to the size reduction of electronic apparatuses.

Embodiment 7

Figure 9:
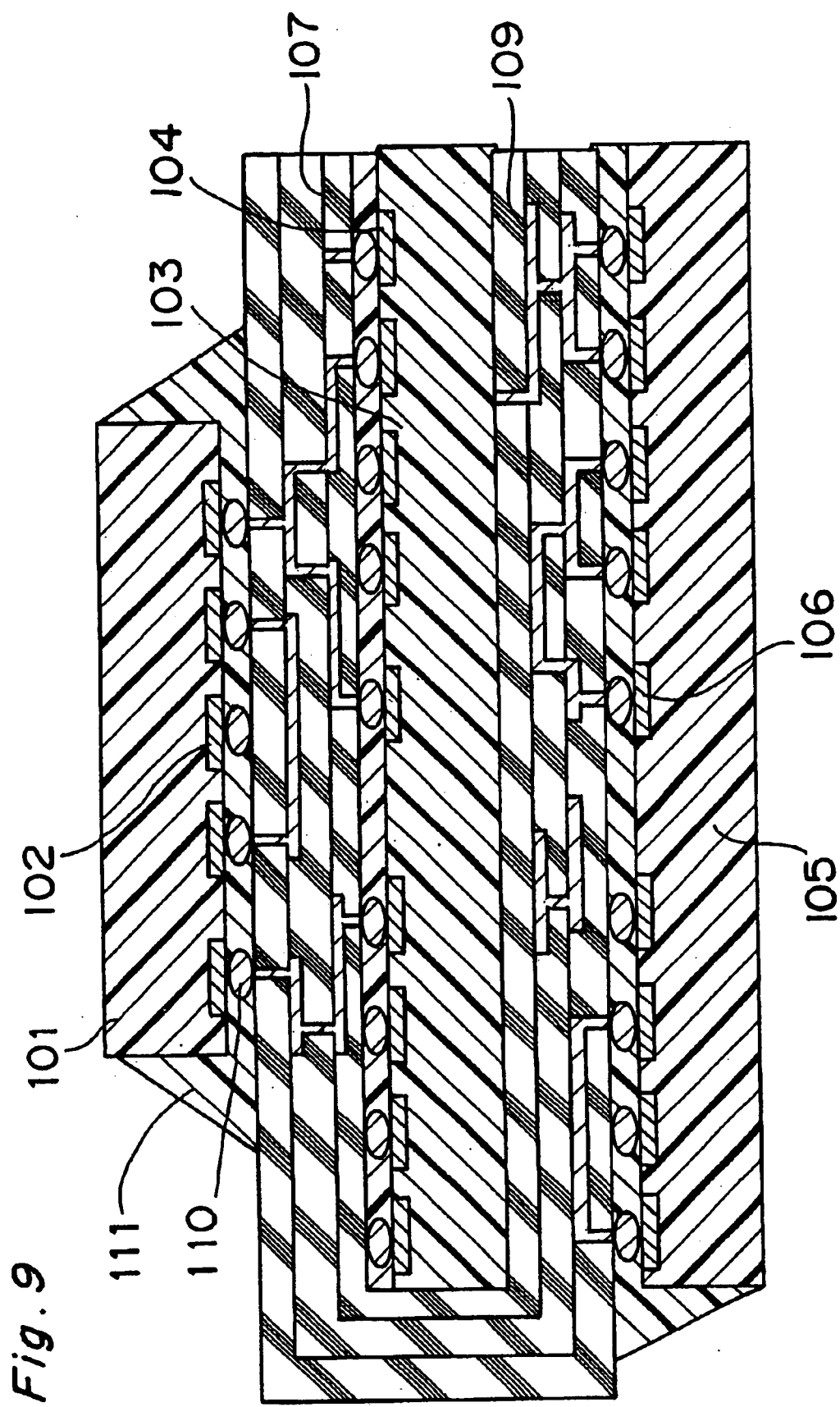
FIG. 9 is a cross sectional view of the semiconductor device according to a seventh embodiment of the present invention.

FIG. 9 is a cross sectional view of a semiconductor device according to a seventh embodiment of the present invention. In the drawing, reference numerals identical to those of FIG. 4 denote the identical or corresponding portions.

According to this embodiment, as shown in FIG. 9, the first semiconductor element 101 and the second semiconductor element 103 are mounted so as to oppose each other via the multi-layer wiring board 107 by flip chip bonding. The multi-layer wiring board 107 is bent to cover the back surface of the second semiconductor element 103 and is bonded onto the back surface of the second semiconductor element 103 by means of an adhesive or the like. Then the third semiconductor element 105 is mounted by flip chip bonding on the multi-layer wiring board 107 which is bonded to the back surface of the second semiconductor element 103 so that the third semiconductor element 105 and the second semiconductor element 103 oppose each other via the multi-layer wiring board 107.

In the semiconductor device of this embodiment, the three semiconductor elements 101, 103, 105 are laminated by bending the multi-layer wiring board 107. Therefore, packaging space can be effectively utilized, thus making it possible to minimize the size of electronic apparatuses.

Although three semiconductor elements are laminated in this embodiment, the semiconductor elements can be mounted in larger number of levels by bending the multi-layer wiring board 107 furthermore.

Furthermore, as shown in FIG. 20, the wiring board 207 may also have only a single insulation layer with circuit patterns formed on each side of the single insulation layer. Inner via holes 109 which extend through the single insulation layer electrically connect the circuit patterns formed on each side. In this embodiment, the wiring board 207 is arranged so that the semiconductor elements 101, 103, and 105 can be arranged as described above with reference to FIG. 9. Thus, packaging space can be effectively utilized so that the size of an electronic apparatus can be minimized.

Embodiment 8

Figure 10:
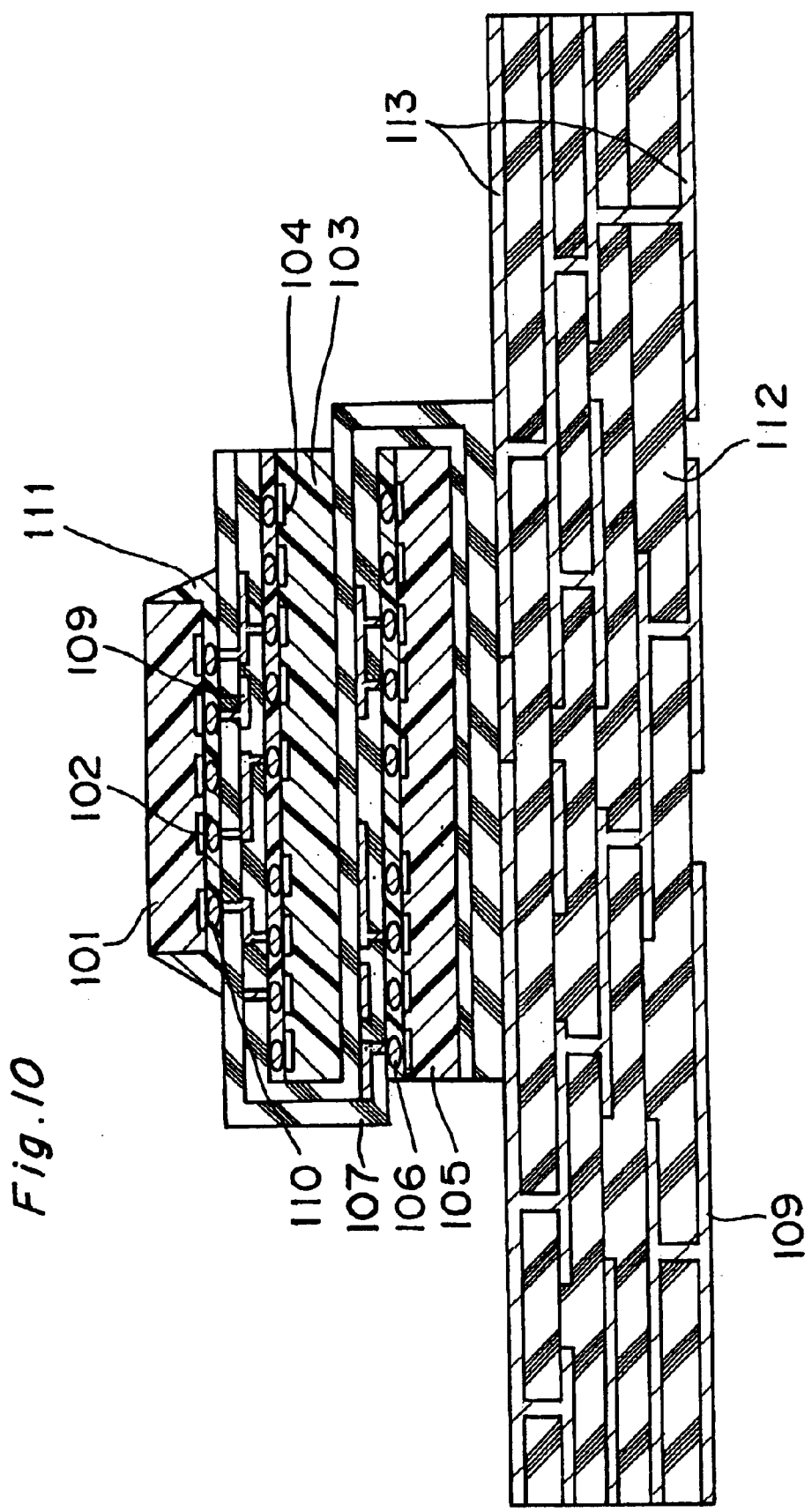
FIG. 10 is a cross sectional view of the module of the semiconductor device according to an eighth embodiment of the present invention.

FIG. 10 is a cross sectional view of a module of the semiconductor device according to an eighth embodiment of the present invention. In the drawing, reference numerals identical to those of FIG. 4 denote the identical or corresponding portions.

According to this embodiment, as shown in FIG. 10, the semiconductor device mounted by lamination using the multi-layer wiring board 107 which is bent over the first, second and third semiconductor elements according to the seventh embodiment is mounted on the mother multi-layer wiring board 112. The multi-layer wiring board 107 and the mother multi-layer wiring board 112 are then electrically connected with each other, thereby making the module.

Electrical connection between the multi-layer wiring board 107 and the mother multi-layer wiring board 112 is further made by directly connecting the circuit pattern formed on the multi-layer wiring board 107 bonded to cover the back surface of the third semiconductor element and the circuit pattern formed on the mother multi-layer wiring board 112.

According to this embodiment, since an electrical connection is made by using the portion under the semiconductor device, the packaging area of the mother multi-layer wiring board 112 can be effectively utilized. As a result, it is possible to further improve the packaging efficiency because the semiconductor devices can be mounted in multiple layers. Thus, it becomes possible to provide a module for semiconductor devices which is very advantageous for the size reduction of electronic apparatuses.

Embodiment 9

Figure 11:
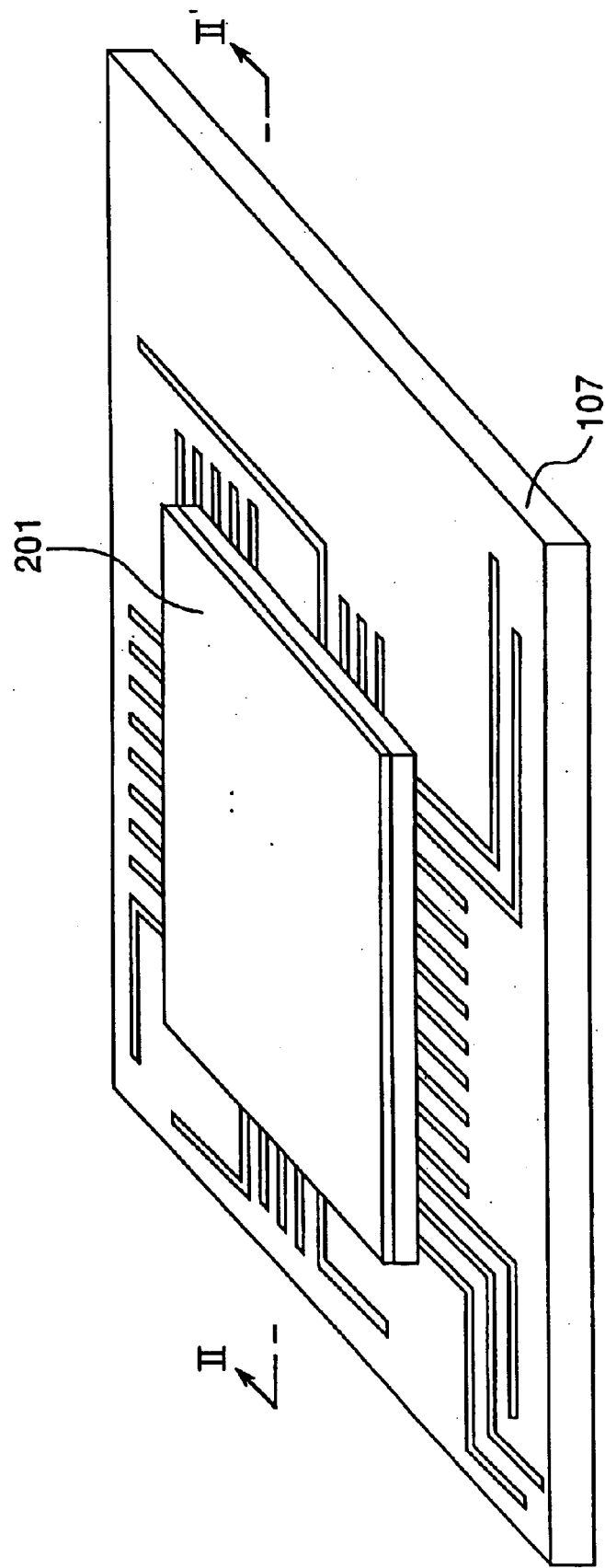
FIG. 11 is a perspective view of the semiconductor device according to a ninth embodiment of the present invention.

FIG. 11 is a perspective view of a semiconductor device according to a ninth embodiment of the present invention, wherein a semiconductor element 201 having electrodes arranged in area array arrangement is mounted on the top surface of a multi-layer wiring board 105. A semiconductor element 203 (not shown) having electrodes arranged in peripheral arrangement is then mounted on the back surface.

Figure 12:
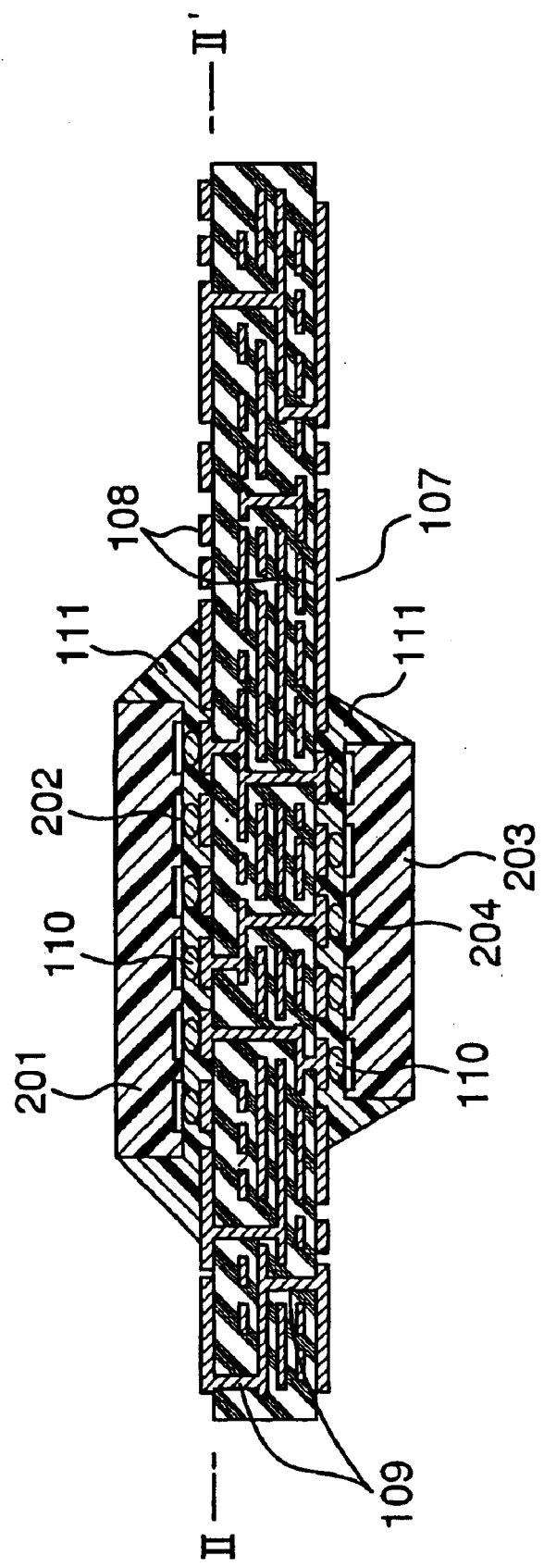
FIG. 12 is a cross sectional view taken along lines II–II' of FIG. 11.

FIG. 12 is a cross sectional view taken along lines II–II' in FIG. 11. In the drawing, numeral 201 denotes a first semiconductor element, 202 denotes electrodes arranged in area array arrangement on the element forming surface of the first semiconductor element 201, 203 denotes a second semiconductor element and 204 denotes electrodes arranged in peripheral arrangement on the element forming surface of the second semiconductor element 203. Numeral 107 denotes the multi-layer wiring board, 108 denotes a circuit pattern formed on the surface of the multi-layer wiring board 107, and 109 denotes inner via holes. Numeral 110 denotes junctions for electrically connecting the semiconductor elements 201, 203 and the circuit pattern 108 provided on the surface of the multi-layer wiring board 107, and 111 denotes an insulating thermosetting resin.

Figure 13B:
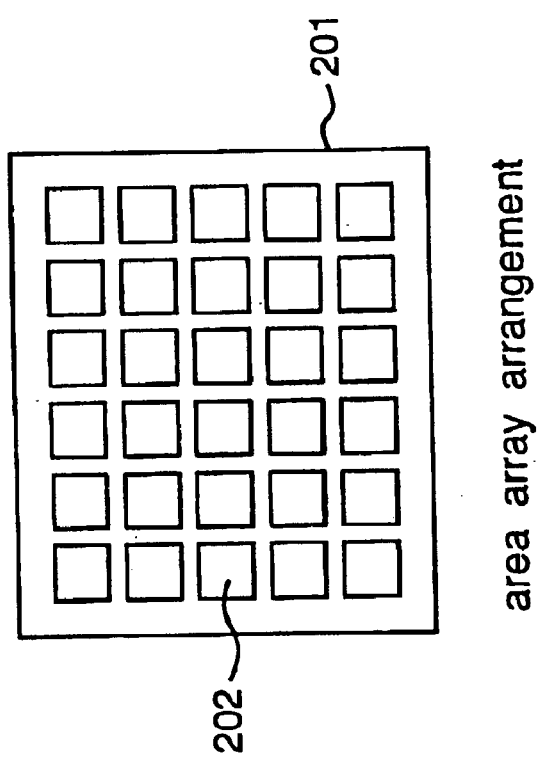
FIGS. 13A, 13B are views showing the arrangement of the electrodes of the semiconductor element.
Figure 13A:
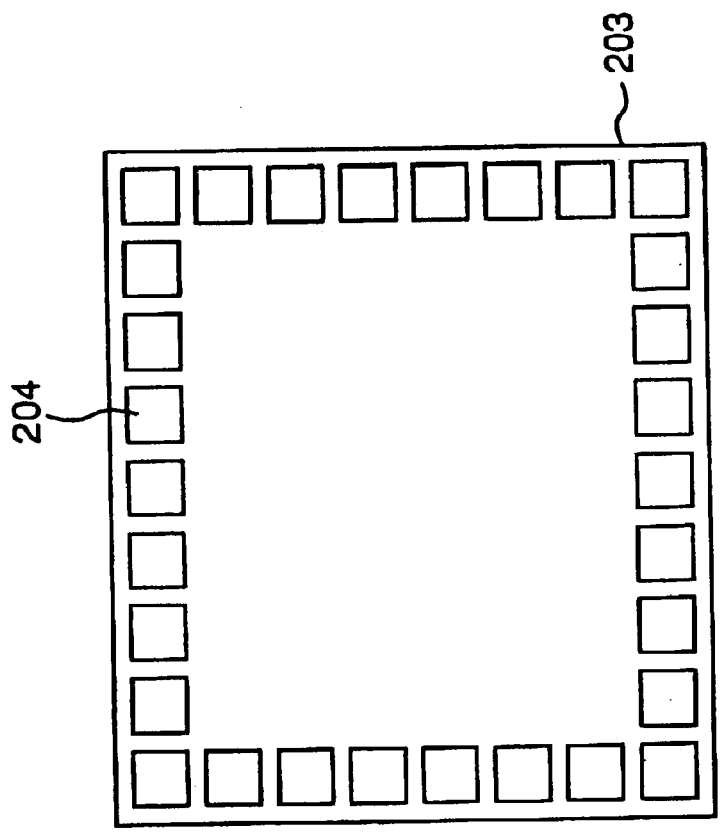

According to this embodiment, as shown in FIGS. 13A, 13B, the semiconductor element having the electrodes arranged in peripheral arrangement and the semiconductor element having the electrodes arranged in area array arrangement are mounted on both sides of the multi-layer wiring board 107.

The area array arrangement of electrodes has recently been increasingly employed in high-performance integrated circuits such as a CPU in order to increase the operating speed of the semiconductor elements and decrease the power consumption.

However, if semiconductor elements having the electrodes arranged in the area array arrangement as described above are mounted on a conventional multi-layer wiring board, a lead wire connecting a central electrode among the electrodes arranged in the area array arrangement becomes too long. Thus, the effort to increase the operating speed of the semiconductor elements is hindered.

According to this embodiment, therefore, the electrodes arranged in the area array arrangement are connected to the other semiconductor elements via the inner via holes 109 which are formed in the multi-layer wiring board 107, thereby reducing the wiring length.

In the process of producing the semiconductor device shown in FIG. 11, the semiconductor element 201 having the electrodes arranged in the area array arrangement and the semiconductor element 203 having the electrodes arranged in the peripheral arrangement are prepared and, after forming the Au ball bumps on the electrodes 201, 204 by using a wire bonding apparatus, a required amount of electrically conductive adhesive is applied to the tips of the ball bumps. The electrically conductive adhesive is made of a mixture of electrically conductive metal powder such as Ag, Cu or Ni and a resin.

The semiconductor element 201 with the ball bumps made of Au or the like and covered with the electrically conductive adhesive is mounted on the top surface of the multi-layer wiring board 107, and the semiconductor element 203 is mounted on the back surface of the multi-layer wiring board 105. Both semiconductor elements are mounted face down by flip chip bonding so as to oppose each other via the multi-layer wiring board 107. The two semiconductor elements are fastened onto the respective sides of the multi-layer wiring board 107 as the adhesive is cured by a heat treatment.

Figure 14A:
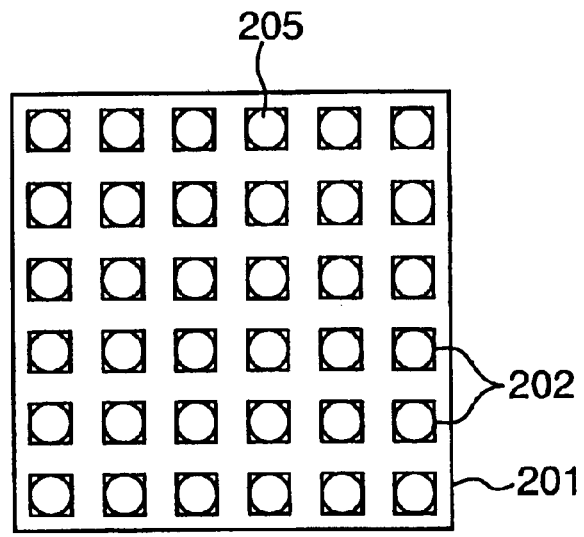
FIG. 14A is a view showing the arrangement of the electrodes of the semiconductor element having the area array electrode arrangement.
Figure 14B:
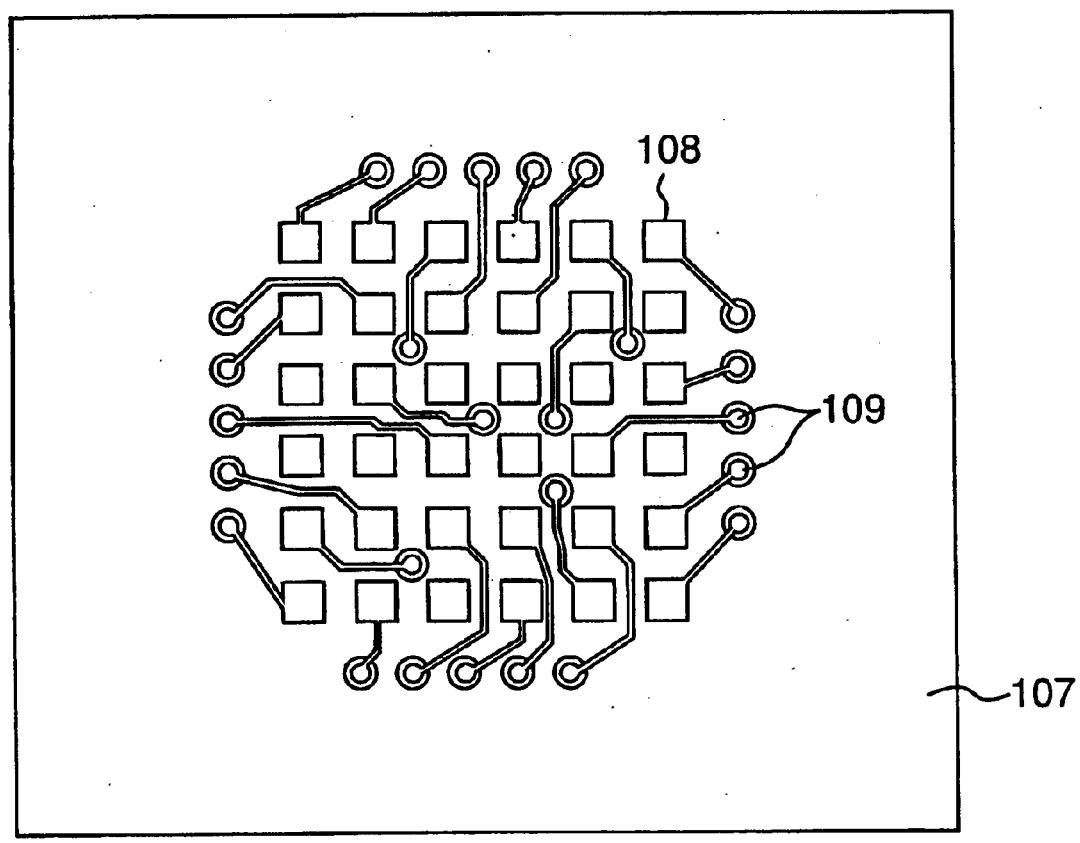
FIG. 14B is a view showing the circuit pattern of the multi-layer wiring board whereon the semiconductor element having the area array electrode arrangement is mounted.

FIG. 14A shows the arrangement of the electrodes of the semiconductor element 201 having the electrodes arranged in area array arrangement, and FIG. 14B shows the circuit pattern formed on the multi-layer wiring board 107 whereon the semiconductor element 201 is mounted. Numeral 205 denotes the Au ball bumps.

As shown in FIG. 14B, use of the multi-layer wiring board 107 having the inner via holes 109 makes it possible to reduce the wiring length by providing the inner via holes 109 just below the circuit pattern located at the center of the circuit pattern of the area array arrangement or in the vicinity thereof. Thus, the three-dimensional wiring is also provides this circuit pattern.

Figure 15A:
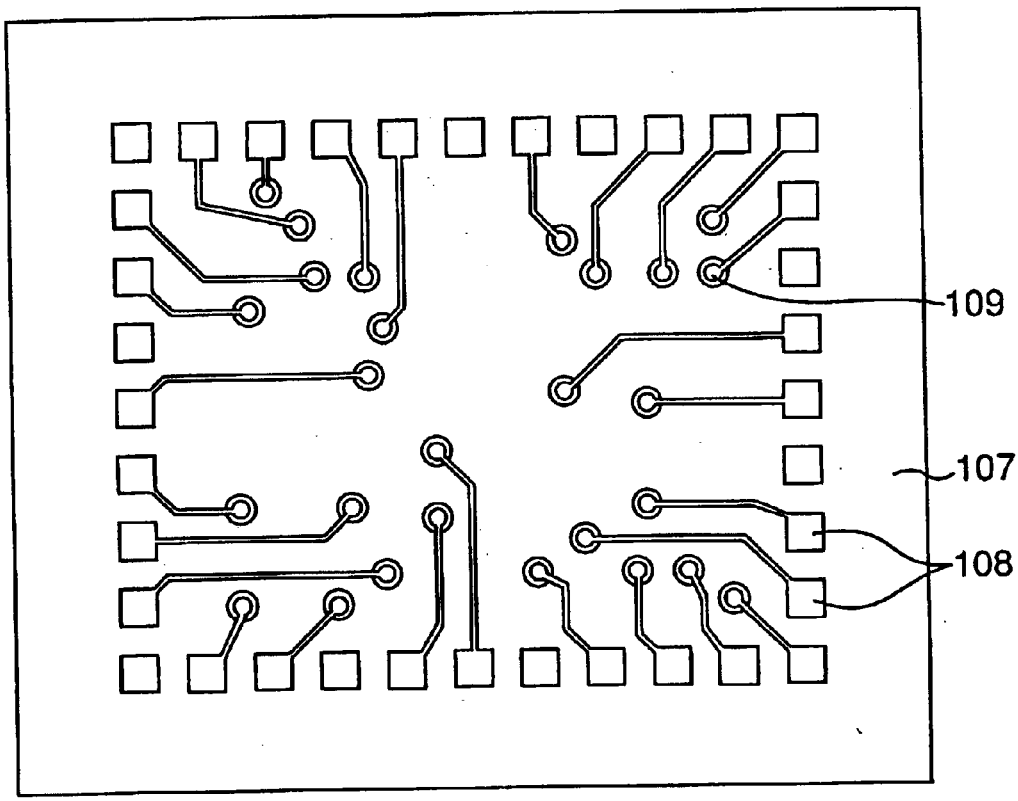
FIG. 15A shows the circuit pattern of the multi-layer wiring board whereon the semiconductor element having a peripheral electrode arrangement is mounted.
Figure 15B:
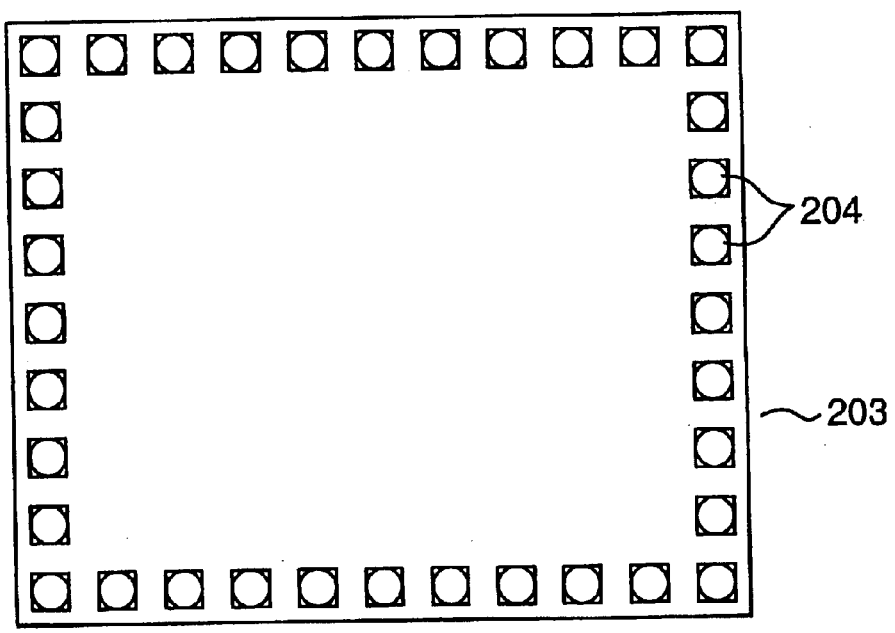
FIG. 15B shows the arrangement of the electrodes of the semiconductor element having the peripheral electrode arrangement.

FIG. 15A shows the circuit pattern 108 provided on the back surface of the multi-layer wiring board 107 whereon the semiconductor element 203 is mounted, and FIG. 15B shows the configuration of the electrodes of the semiconductor element 203 having the peripheral electrode arrangement.

The semiconductor element having the electrodes arranged in the area array arrangement is also checked to make sure of normal functions in electrical tests after the semiconductor elements 201, 203 are fastened onto the multi-layer wiring board 107 by curing the electrically conductive adhesive, similarly to the semiconductor element having the electrodes of peripheral arrangement.

Then after filling the gap between the semiconductor elements 201, 203 and the multi-layer wiring board with the thermosetting resin, the thermosetting resin is completely cured by a heat treatment, thereby increasing the mechanical strength and the junction strength.

If any of the semiconductor elements is found to be defective during the electrical test, only the defective semiconductor element is removed and replaced with a new semiconductor element. In this regard, bonding strength of the electrically conductive adhesive is controlled to a minimum necessary level thereby to make it easy to remove the semiconductor element. Proper bonding strength per one bump for this purpose is about $3 \times 10^6$ to $30 \times 10^6$ N/m².

As described above, this embodiment has the effects of, in addition to the effects described in conjunction with the first embodiment, reducing the wiring length, increasing the operating speed of the semiconductor device, and decreasing the power consumption. These effects are created because the semiconductor element 201 having the electrodes of the area array arrangement and the semiconductor element 203 having the electrodes of the peripheral arrangement mounted on both sides by flip chip bonding are electrically connected via the multi-layer wiring board 105 having the inner via holes 109 formed therein.

Particularly for the semiconductor element having the electrodes arranged in the area array arrangement, wiring length of the electrodes located near the center of the semiconductor element can be greatly reduced compared to a semiconductor device which employs the conventional wiring board.

Another flip chip mounting technique described in conjunction with the first embodiment may also be applied.

It is also possible to mount the semiconductor elements having the electrodes of area array arrangement on both sides of the multi-layer wiring board 107.

Embodiment 10

Figure 16:
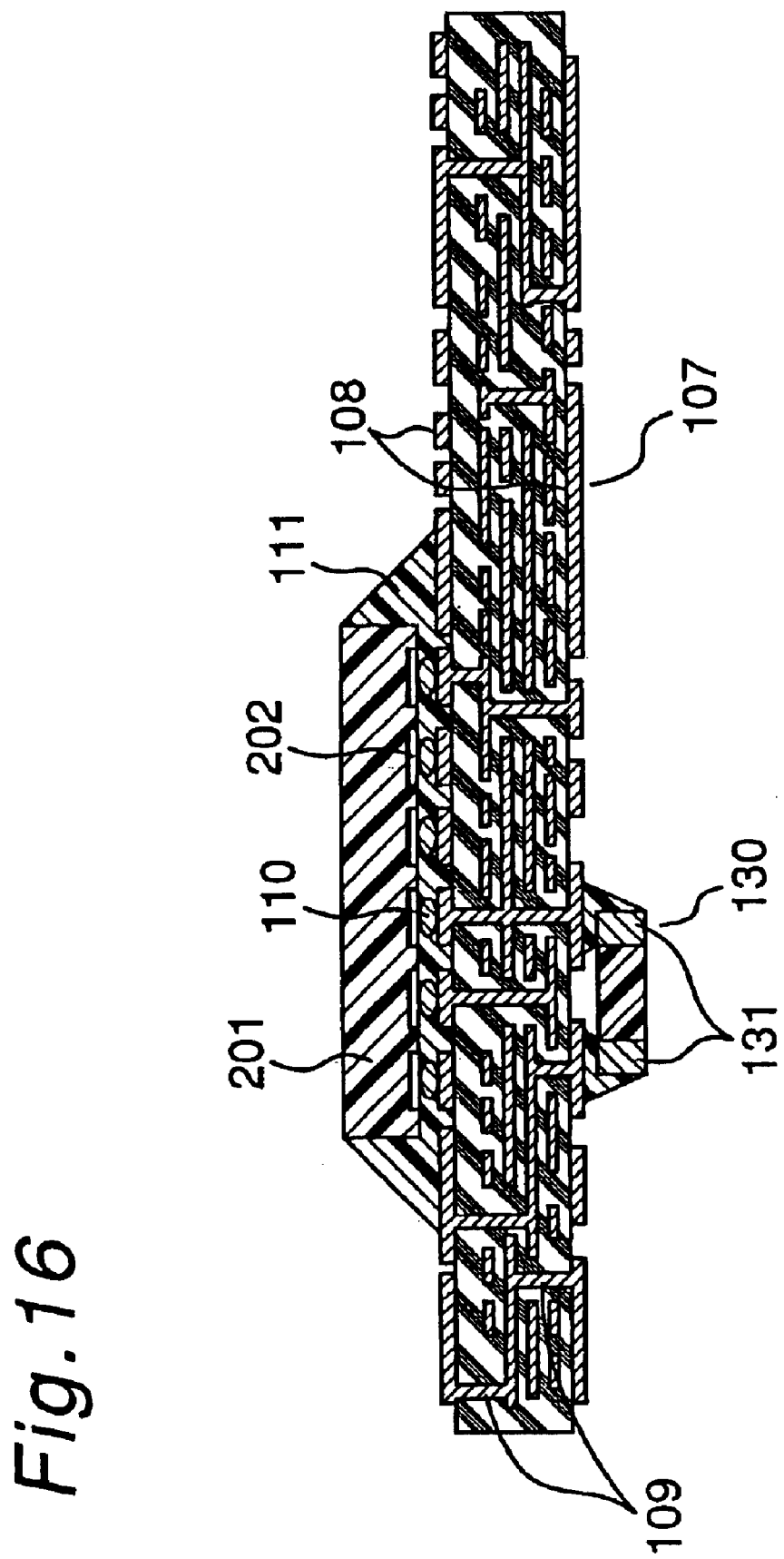
FIG. 16 is a cross sectional view of the semiconductor device according to a tenth embodiment of the present invention.

FIG. 16 is a cross sectional view of a module of the semiconductor device according to a tenth embodiment of the present invention. In the drawing, reference numerals identical to those of FIG. 1 denote the identical or corresponding portions. Numeral 130 denotes a bypass capacitor and 131 denotes leads of the bypass capacitor.

According to this embodiment, the semiconductor element 201 having the electrodes of the area array arrangement is mounted on the top surface of the multi-layer wiring board 107 and one or more bypass capacitors 131 is mounted on the back surface of the multi-layer wiring board 107.

Figure 17A:
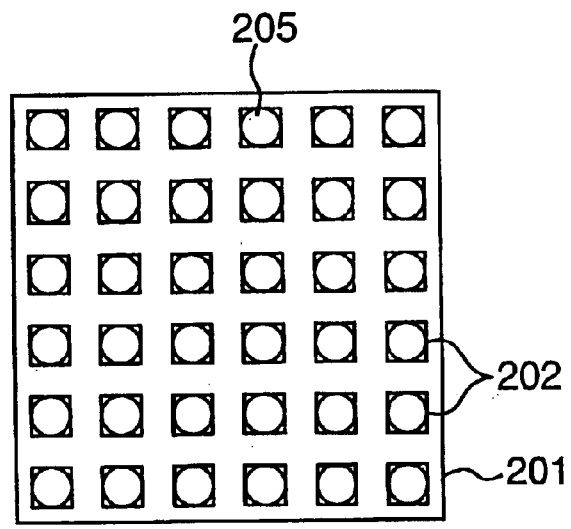
FIG. 17A shows the arrangement of the electrodes of the semiconductor element having an area array electrode arrangement.
Figure 17B:
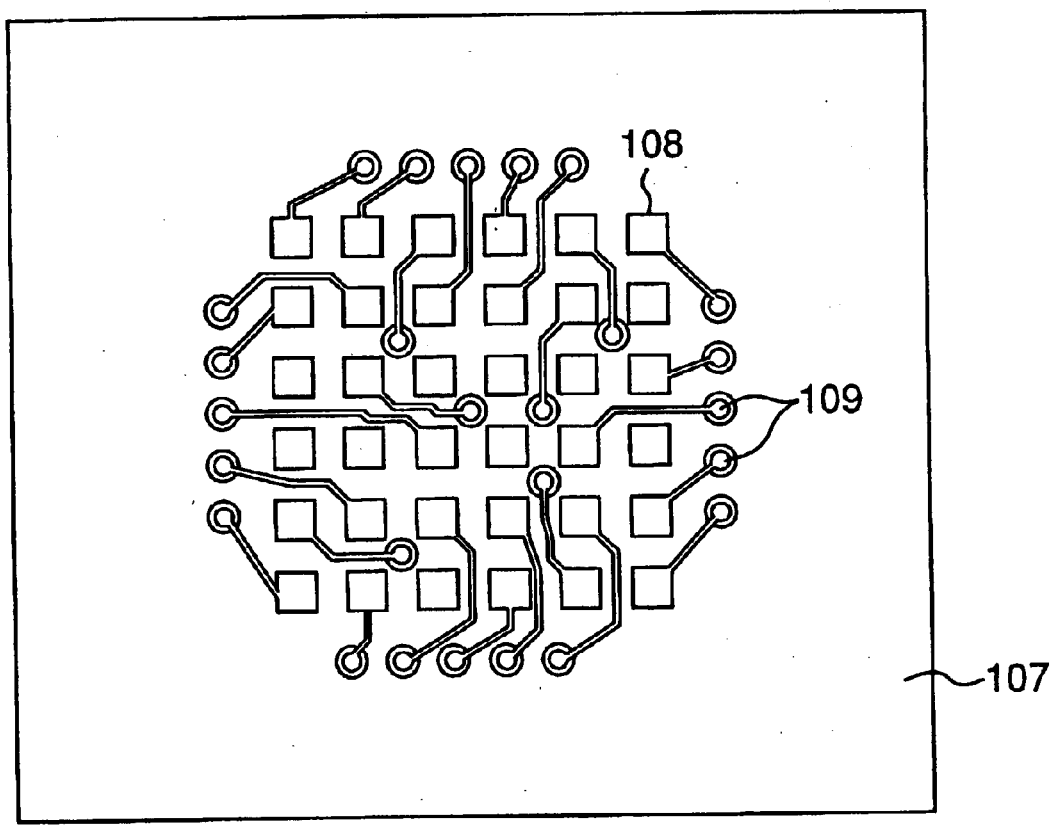
FIG. 17B shows the circuit pattern of the multi-layer wiring board whereon the semiconductor element having the area array electrode arrangement is mounted.

FIG. 17A shows the configuration of the electrodes of the semiconductor element 201 having the electrodes of the area array arrangement, and FIG. 17B shows the circuit pattern formed on the multi-layer wiring board 107 whereon the semiconductor element 201 is mounted. Numeral 205 denotes the Au ball bumps.

Figure 18A:
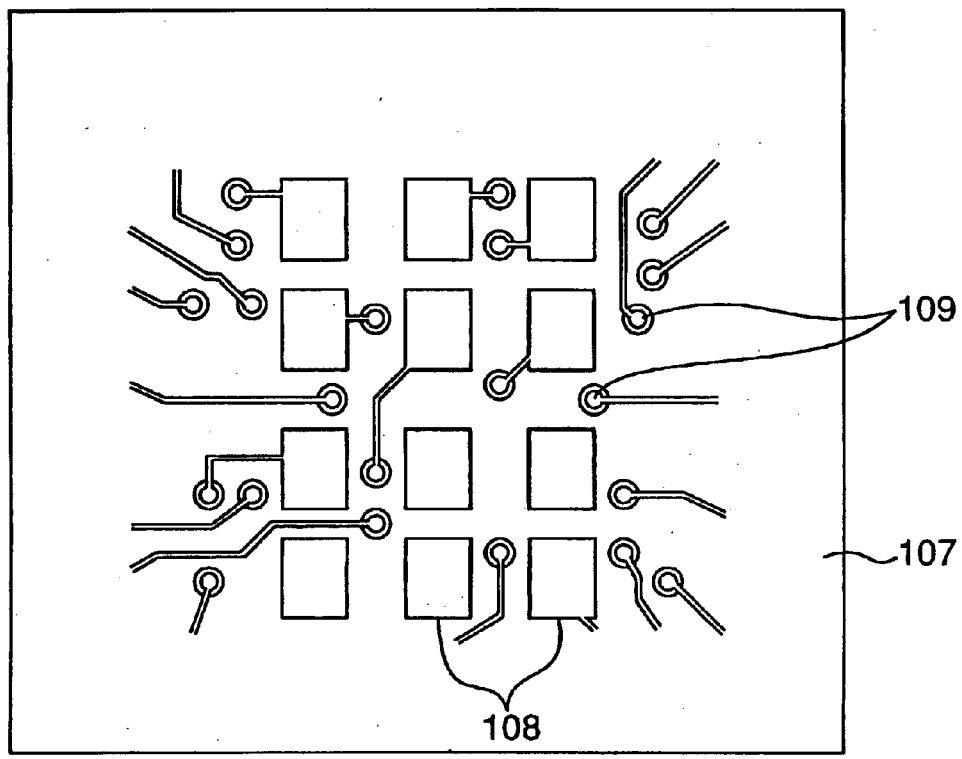
FIG. 18A shows the circuit pattern of the multi-layer wiring board whereon the bypass capacitor is mounted.
Figure 18B:
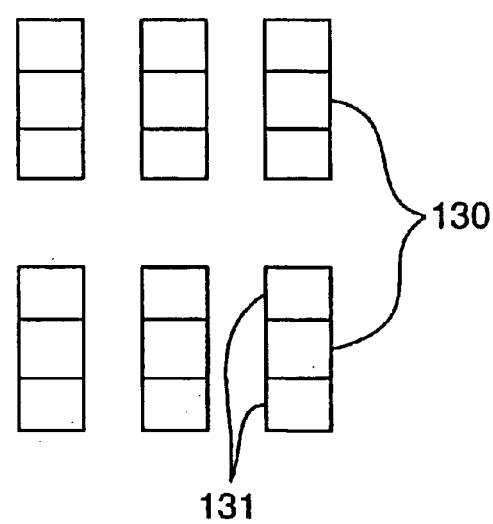
FIG. 18B shows the lead arrangement of the bypass capacitor.
Figure 19:
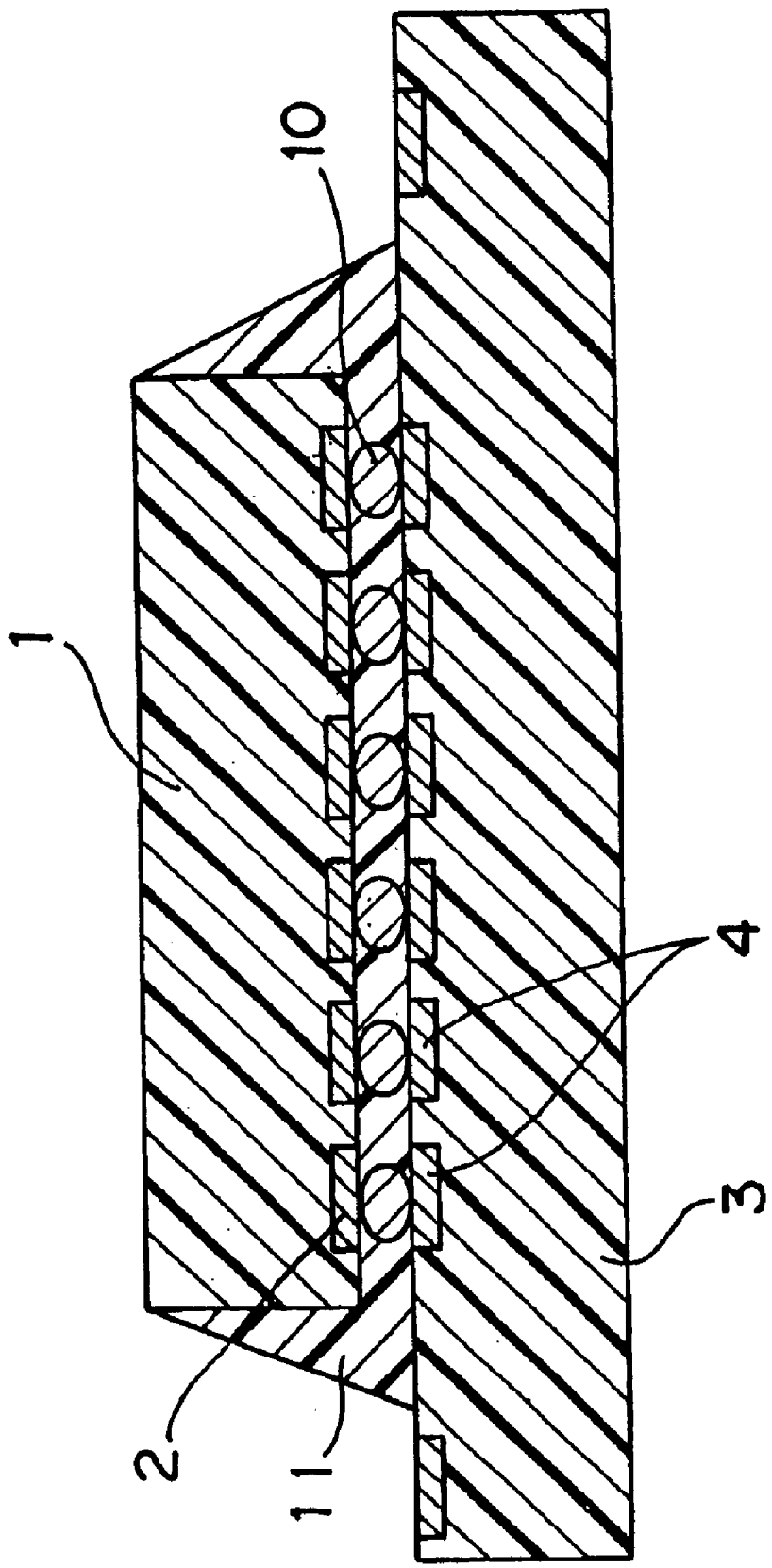
FIG. 19 is a cross sectional view of the semiconductor device of the chip-on-chip connection of the prior art.

FIG. 18A shows the circuit pattern 108 formed on the back surface of the multi-layer wiring board 107 whereon six bypass capacitors 131 are mounted, and FIG. 18B shows the lead arrangement of the six bypass capacitors.

Although the number of bypass capacitors 131 is six in this embodiment, the number may be arbitrarily set as required.

In the semiconductor device of this embodiment, the use of the multi-layer wiring board 107 having the inner via holes 109 similarly to the case of the ninth embodiment makes it possible to reduce the wiring length and thereby increase the operating speed of the semiconductor device and decrease the power consumption, by providing the inner via holes 109 just below the circuit pattern located at the center of the circuit pattern of the area array arrangement or in the vicinity thereof, in order to make three-dimensional wiring also for this circuit pattern.

Particularly in the case of bypass capacitor 131 which is provided for the purpose of reducing the noise generated in the semiconductor device, elongation of the wiring between the bypass capacitor 131 and the semiconductor element 201 leads to increased noise due to the wiring. Thus, the effect of installing the bypass capacitor 131 is cancelled out.

Connecting the bypass capacitor 131 and the semiconductor element 201 by the three-dimensional wiring comprising the inner via holes 109 makes it possible to reduce the wiring length and minimize the noise generated in the semiconductor device.

We claim:

1. A semiconductor device comprising:
a multi-layer wiring board having a first side and a second side opposite said first side, and including a plurality of insulation layers and a plurality of circuit pattern layers alternately laminated with said insulation layers, one of said circuit pattern layers being formed on a first side and a second side of each of said insulation layers, each of said insulation layers having a plurality of inner via holes extending between said first side and said second side of each of said insulation layers and electrically connecting said circuit pattern layers so as to form a three-dimensional wiring pattern;
a first semiconductor element including electrodes and being mounted on said first side of said multi-layer wiring board so that a front surface of said first semiconductor element faces said first side of said multi-layer wiring board; and
a second semiconductor element including electrodes and having a front surface and a back surface, said second semiconductor element being mounted on said second side of said multi-layer wiring board so that said front surface of said second semiconductor element faces said second side of said multi-layer wiring board and so that at least a portion of said front surface of said second semiconductor element faces at least a portion of said front surface of said first semiconductor element via said multi-layer wiring board, said electrodes of said second semiconductor element and said electrodes of said first semiconductor element being connected by said three-dimensional wiring pattern, said multi-layer wiring board being bent around said second semiconductor element so as to cover said back surface of said second semiconductor element.

2. The device of claim 1, wherein each of said insulation layers comprise a resin-impregnated fiber sheet.

3. The device of claim 2, wherein said first semiconductor element and said second semiconductor element are mounted face down on said multi-layer wiring board by flip chip bonding.

4. The device of claim 1, wherein said first semiconductor element and said second semiconductor element are mounted face down on said multi-layer wiring board by flip chip bonding.

5. The device of claim 1, wherein said electrodes of one of said first semiconductor element and said second semiconductor element are formed in an area array arrangement.

6. The device of claim 1, wherein said electrodes of said first semiconductor element are formed in an area array arrangement, and said electrodes of said second semiconductor element are formed in a peripheral arrangement, said first semiconductor element and said second semiconductor element being mounted face down on said multi-layer wiring board by flip chip bonding.

7. The device of claim 1, wherein said second semiconductor element comprises an electronic component including electrodes, said first semiconductor element being mounted face down on said multi-layer wiring board by flip chip bonding such that said electrodes of said first semiconductor element and said electrodes of said electronic component are connected by said three-dimensional wiring pattern.

8. The device of claim 7, wherein said electronic component comprises a bypass capacitor.

9. The device of claim 1, wherein said multi-layer wiring board is bonded to said back surface of said second semiconductor element.

10. A semiconductor device comprising:
a wiring board having a first side and a second side opposite said first side, and including an insulation layer having a first side and a second side, said wiring board further including a circuit pattern layer formed on each of said first side and said second side, said insulation layer having a plurality of inner via holes extending between said first side and said second side so as to electrically connect said circuit pattern layers such that a three-dimensional wiring pattern is formed;
a first semiconductor element including electrodes and being mounted on said first side of said wiring board so that a front surface of said first semiconductor element faces said first side of said multi-layer wiring board; and
a second semiconductor element including electrodes and having a front surface and a back surface, said second semiconductor element being mounted on said second side of said wiring board so that said front surface of said second semiconductor element faces said second side of said wiring board and so that at least a portion of said front surface of said second semiconductor element faces at least a portion of said front surface of said first semiconductor element via said wiring board, said electrodes of said second semiconductor element and said electrodes of said first semiconductor element being connected by said three-dimensional wiring pattern, said wiring board being bent around said second semiconductor element so as to cover said back surface of said second semiconductor element.

11. The device of claim 10, wherein said insulation layer comprises a resin-impregnated fiber sheet.

12. The device of claim 11, wherein said first semiconductor element and said second semiconductor element are mounted face down on said wiring board by flip chip bonding.

13. The device of claim 10, wherein said first semiconductor element and said second semiconductor element are mounted face down on said wiring board by flip chip bonding.

14. The device of claim 10, wherein said electrodes of one of said first semiconductor element and said second semiconductor element are formed in an area array arrangement.

15. The device of claim 10, wherein said electrodes of said first semiconductor element are formed in an area array arrangement, and said electrodes of said second semiconductor element are formed in a peripheral arrangement, said first semiconductor element and said second semiconductor element being mounted face down on said wiring board by flip chip bonding.

16. The device of claim 10, wherein said second semiconductor element comprises an electronic component including electrodes, said first semiconductor element being mounted face down on said wiring board by flip chip bonding such that said electrodes of said first semiconductor element and said electrodes of said electronic component are connected by said three-dimensional wiring pattern.

17. The device of claim 16, wherein said electronic component comprises a bypass capacitor.

18. The device of claim 10, wherein said wiring board is bonded to said back surface of said second semiconductor element.

19. The device of claim 10, further comprising a third semiconductor element mounted on said wiring board by flip chip bonding so as to oppose said back surface of said second semiconductor element via said wiring board.

20. The device of claim 19, further comprising:
a mother multi-layer wiring board having a circuit pattern formed on a surface thereof, said third semiconductor element being mounted on said mother multi-layer wiring board such that said mother multi-layer wiring board and said third semiconductor element are electrically connected.

21. The device of claim 10, further comprising:
a mother multi-layer wiring board having a circuit pattern formed on a surface thereof, said wiring board being mounted on said mother multi-layer wiring board such that said mother multi-layer wiring board and said wiring board are electrically connected.

22. A semiconductor device comprising:
a wiring board having a first side and a second side opposite said first side, and including an insulation layer having a first side and a second side, said wiring board further including a circuit pattern layer formed on each of said first side and said second side, said insulation layer having a plurality of inner via holes extending between said first side and said second side so as to electrically connect said circuit pattern layers such that a three-dimensional wiring pattern is formed;

an electronic component including electrodes and being mounted on said first side of said wiring board so that a front surface of said electronic component faces said first side of said wiring board; and a semiconductor element including electrodes and having a front surface and a back surface, said semiconductor element being mounted on said second side of said wiring board so that said front surface of said semiconductor element faces said second side of said wiring board and so that at least a portion of said front surface of said semiconductor element faces at least a portion of said front surface of said electronic component via said wiring board, said electrodes of said semiconductor element and said electrodes of said electronic component being connected by said three-dimensional wiring pattern, said wiring board being bent around said semiconductor element so as to cover said back surface of said semiconductor element.

23. The device of claim 22, wherein said wiring board is bonded to said back surface of said semiconductor element.

* * * * *